United States Patent
Kim et al.

(10) Patent No.: US 10,976,592 B2
(45) Date of Patent: Apr. 13, 2021

(54) DISPLAY DEVICE AND METHOD OF MANUFACTURING THE SAME

(71) Applicant: Samsung Display Co., Ltd., Yongin-si (KR)

(72) Inventors: Sikwang Kim, Daegu (KR); Saehee Han, Seoul (KR); Hoon Kang, Yongin-si (KR); Sumin An, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 140 days.

(21) Appl. No.: 16/040,314

(22) Filed: Jul. 19, 2018

(65) Prior Publication Data
US 2019/0137815 A1 May 9, 2019

(30) Foreign Application Priority Data
Nov. 3, 2017 (KR) .......................... 10-2017-0146242

(51) Int. Cl.
*G02F 1/1335* (2006.01)
*G02F 1/1368* (2006.01)
(Continued)

(52) U.S. Cl.
CPC ........ *G02F 1/133514* (2013.01); *G02F 1/017* (2013.01); *G02F 1/1368* (2013.01); *G02F 1/133512* (2013.01); *G02F 1/133602* (2013.01); *G02F 1/134309* (2013.01); *G02F 1/136286* (2013.01); *G09G 3/3688* (2013.01);
(Continued)

(58) Field of Classification Search
None
See application file for complete search history.

(56) References Cited

U.S. PATENT DOCUMENTS

| | | | |
|---|---|---|---|
| 6,072,450 A * | 6/2000 | Yamada | G09G 3/3233 345/76 |
| 9,184,403 B2 | 11/2015 | Cho et al. | |
| 9,722,001 B2 | 8/2017 | Song et al. | |
| 2006/0066779 A1* | 3/2006 | Kobayashi | G02F 1/133512 349/106 |

(Continued)

FOREIGN PATENT DOCUMENTS

| | | |
|---|---|---|
| JP | 2014-89281 A | 5/2014 |
| KR | 10-2015-0047401 A | 5/2015 |

(Continued)

*Primary Examiner* — Christopher R Lamb
(74) *Attorney, Agent, or Firm* — Lewis Roca Rothgerber Christie LLP

(57) ABSTRACT

A display device includes a display panel including a plurality of pixels; and a color filter member on the display panel. The color filter member includes a partition member where a plurality of opening parts each overlapping with at least one of the plurality of pixels on a plane is defined, a liquid-repellent coating layer covering the partition member, and a color conversion member including a first color conversion pattern and a second conversion pattern, which are in each of the opening parts and provide different light. The first color conversion pattern includes a first bent part and a first color conversion part, which include the same material and contact each other to form an interface. The second color conversion pattern includes a second bent part and a second color conversion part, which include the same material and contact each other to form an interface.

20 Claims, 19 Drawing Sheets

(51) Int. Cl.
    *G02F 1/1343*      (2006.01)
    *G02F 1/13357*     (2006.01)
    *G02F 1/1362*      (2006.01)
    *G09G 3/36*        (2006.01)
    *H01L 27/32*       (2006.01)
    *G02F 1/017*       (2006.01)
    *H01L 51/50*       (2006.01)
    *H01L 51/52*       (2006.01)
    *G09G 3/3225*      (2016.01)

(52) U.S. Cl.
    CPC ...... *H01L 27/3262* (2013.01); *H01L 27/3265* (2013.01); *H01L 51/5036* (2013.01); *H01L 51/5056* (2013.01); *H01L 51/5072* (2013.01); *H01L 51/5092* (2013.01); *H01L 51/5206* (2013.01); *H01L 51/5221* (2013.01); *G02F 2001/01791* (2013.01); *G02F 2201/121* (2013.01); *G02F 2201/123* (2013.01); *G09G 3/3225* (2013.01); *G09G 3/3648* (2013.01); *G09G 2300/0452* (2013.01)

(56) References Cited

U.S. PATENT DOCUMENTS

| | | | |
|---|---|---|---|
| 2007/0126337 A1* | 6/2007 | Inagaki | G02F 1/13394 313/495 |
| 2011/0038070 A1* | 2/2011 | Nakamata | G02B 5/201 359/891 |
| 2011/0108880 A1* | 5/2011 | Yanagihara | H01L 27/3246 257/100 |
| 2017/0090243 A1 | 3/2017 | Song et al. | |
| 2017/0090247 A1 | 3/2017 | Lee et al. | |
| 2017/0125740 A1 | 5/2017 | Lee et al. | |
| 2017/0299923 A1* | 10/2017 | Kuksenkov | G02F 1/133617 |

FOREIGN PATENT DOCUMENTS

| | | |
|---|---|---|
| KR | 10-2016-0070272 A | 6/2016 |
| KR | 10-2017-0037703 A | 4/2017 |
| KR | 10-2017-0039064 A | 4/2017 |
| KR | 10-2017-0051764 A | 5/2017 |
| KR | 10-2019-0009871 A | 1/2019 |

* cited by examiner

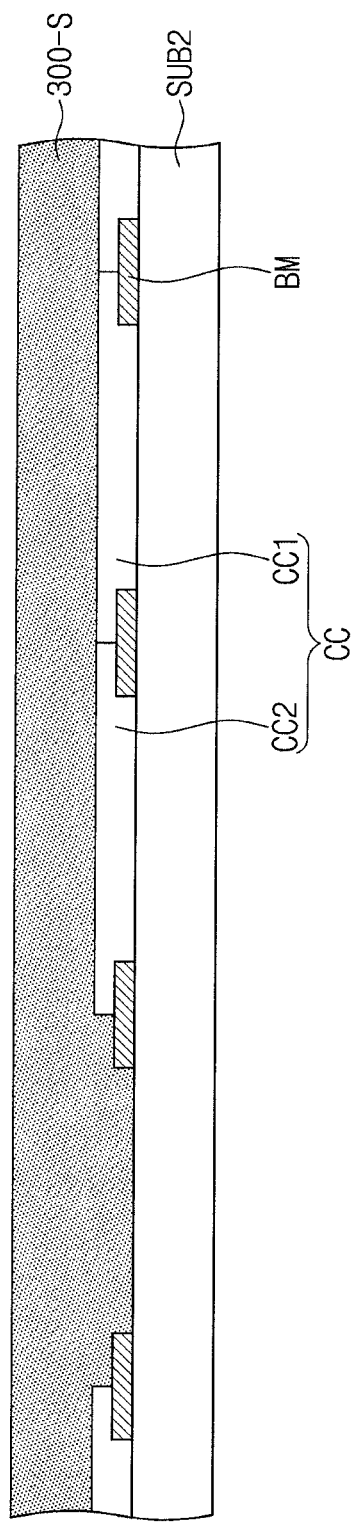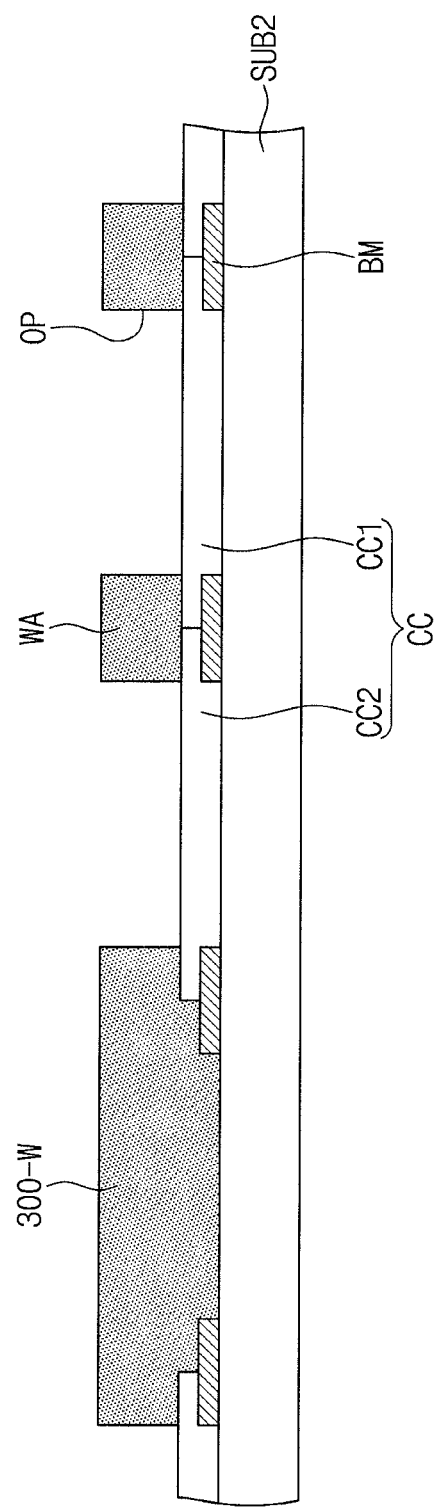

DISPLAY DEVICE AND METHOD OF MANUFACTURING THE SAME

CROSS-REFERENCE TO RELATED APPLICATION

This application claims priority to and the benefit of Korean Patent Application No. 10-2017-0146242, filed on Nov. 3, 2017, the entire contents of which are incorporated herein by reference.

BACKGROUND

The present disclosure relates to a display device and a method of manufacturing the same, and for example, to a display device having a color filter member including quantum dots or fluorescent substances and a method of manufacturing the same.

Liquid crystal display devices, as one of the most widely used flat panel display devices, are composed of two substrates where electric field generating electrodes such as a pixel electrode and a common electrode are formed, and a liquid crystal layer interposed therebetween. A voltage is applied to the electric field generating electrode to generate an electric field in the liquid crystal layer, thereby determining the orientation of the liquid crystal molecules in the liquid crystal layer and controlling the polarization of the incident light to display an image.

Liquid crystal display devices use a color filter for color formation, and light emitted from a backlight source passes through a red color filter, a green color filter, and a blue color filter. At this time, light loss occurs by each color filter or polarizing plate.

To compensate for this loss of light and provide high color reproducibility, a photo-luminescent liquid crystal display device (PL-LCD) has been proposed in which a color conversion material is applied instead of a color filter. The PL-LCD device is a liquid crystal display device that replaces the color filter used in other liquid crystal display devices with a quantum dot color conversion layer. The PL-LCD device displays a color image by using a visible light generated when a light of a low wavelength band such as ultraviolet or blue light emitted from a light source and controlled by a liquid crystal layer is irradiated to a color conversion layer (CCL).

The manufacturing process of such a PL-LCD device may be performed by depositing a quantum dot through an ink-jet process. In this process, an overflow phenomenon may occur due to over-coating, resulting in color mixing with other pixel regions. When a small amount is applied, a not-fill phenomenon may occur and optical characteristics may be deteriorated.

SUMMARY

The present disclosure provides a display device with improved color reproducibility. The present disclosure also provides a method of manufacturing a display device, which reduces the manufacturing cost and time by improving the defective ratio occurring during a process.

An embodiment of the present disclosure provides a display device including: a display panel including a plurality of pixels and a base substrate; and a color filter member disposed on the display panel and configured to receive a light provided from the plurality of pixels, wherein the color filter member includes: a partition member where a plurality of opening parts each overlapping with at least one of the plurality of pixels on a plane is defined; a liquid-repellent coating layer configured to cover the partition member; and a color conversion member including a first color conversion pattern and a second conversion pattern, which are disposed in each of the opening parts and provide different light, wherein the first color conversion pattern includes a first bent part and a first color conversion part, which include the same material and contact each other to form an interface; and the second color conversion pattern includes a second bent part and a second color conversion part, which include the same material and contact each other to form an interface.

In an embodiment, the color conversion member may include at least one of a plurality of quantum dots and a plurality of fluorescent substances corresponding to the different light.

In an embodiment, the color filter member further comprises blocking pattern may be disposed between the base substrate and the color conversion member and blocking a blue light.

In an embodiment, the color filter member may overlap at least a part of the partition member and may further include a light blocking member for blocking light.

In an embodiment, the light blocking member further comprises a light blocking member may have the same (e.g., substantially the same) form as the partition member and may be block light.

In an embodiment, the first bent part may overlap one opening part among the plurality of opening parts and may be disposed in plurality being spaced apart from each other, and the plurality of first bent parts may be covered by the first color conversion part.

In an embodiment, the first bent part may overlap one opening part among the plurality of opening parts and may be provided in plurality, and the plurality of first bent parts may be stacked in a thickness direction and disposed, wherein the interface may be formed between first bent parts contacting the first color conversion part among the plurality of first bent parts.

In an embodiment, the interface may have a curved form.

In an embodiment, the color filter member may further include a third color conversion pattern disposed in the opening parts and configured to provide different light from the first color conversion pattern and the second color conversion pattern.

In an embodiment, the third color conversion pattern may be made of the same material as the partition member.

In an embodiment, the third color conversion layer may be covered by the liquid-repellent coating layer.

In an embodiment, the first color conversion pattern may overlap at least two pixels among the pixels.

In an embodiment, each of the plurality of pixels may include a thin film transistor and a liquid crystal capacitor coupled (or connected) to the thin film transistor.

In an embodiment, each of the plurality of pixels may include a thin film transistor and an organic light emitting element coupled (or connected) to the thin film transistor.

In an embodiment, the light may be blue light.

In an embodiment of the present disclosure, a method of manufacturing a display device includes: forming a partition member by forming by an initial film on the base substrate and forming a plurality of opening parts in the initial film; forming a liquid-repellent coating layer by covering the opening parts and the partition member with a liquid-repellent material; forming a first pattern and second pattern by dropping first quantum dots and second quantum dots in each of a first opening part and a second opening part different from each other among the opening parts; forming a first bent part and a second bent part by drying the first quantum dots and the second quantum dots filled in the first pattern and the second pattern, respectively; forming a third pattern and a fourth pattern by filling the first quantum dots in the first opening part and filling the second quantum dots in the second opening part, respectively; and forming a first color conversion part and a second color conversion part by drying the third pattern and the fourth pattern.

In an embodiment, the method may further include forming a plurality of first patterns by dropping the first quantum dots in the first opening part a plurality of times along one direction.

In an embodiment, the method may further include forming a plurality of first patterns stacked in a thickness direction by dropping the first quantum dots at a fixed same position in the first opening part a plurality of times.

In an embodiment, the method may further include forming an interface by drying individually each time the first quantum dots are dropped in the thickness direction and stacked.

In an embodiment, the forming of the initial film on the base substrate may include a third color conversion part including the same material as the initial film and having the same thickness as the initial film.

BRIEF DESCRIPTION OF THE DRAWINGS

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings:

FIGS. 8A-8D illustrate a method of manufacturing a display device according to an embodiment of the present disclosure.

DETAILED DESCRIPTION

Figure 1A:
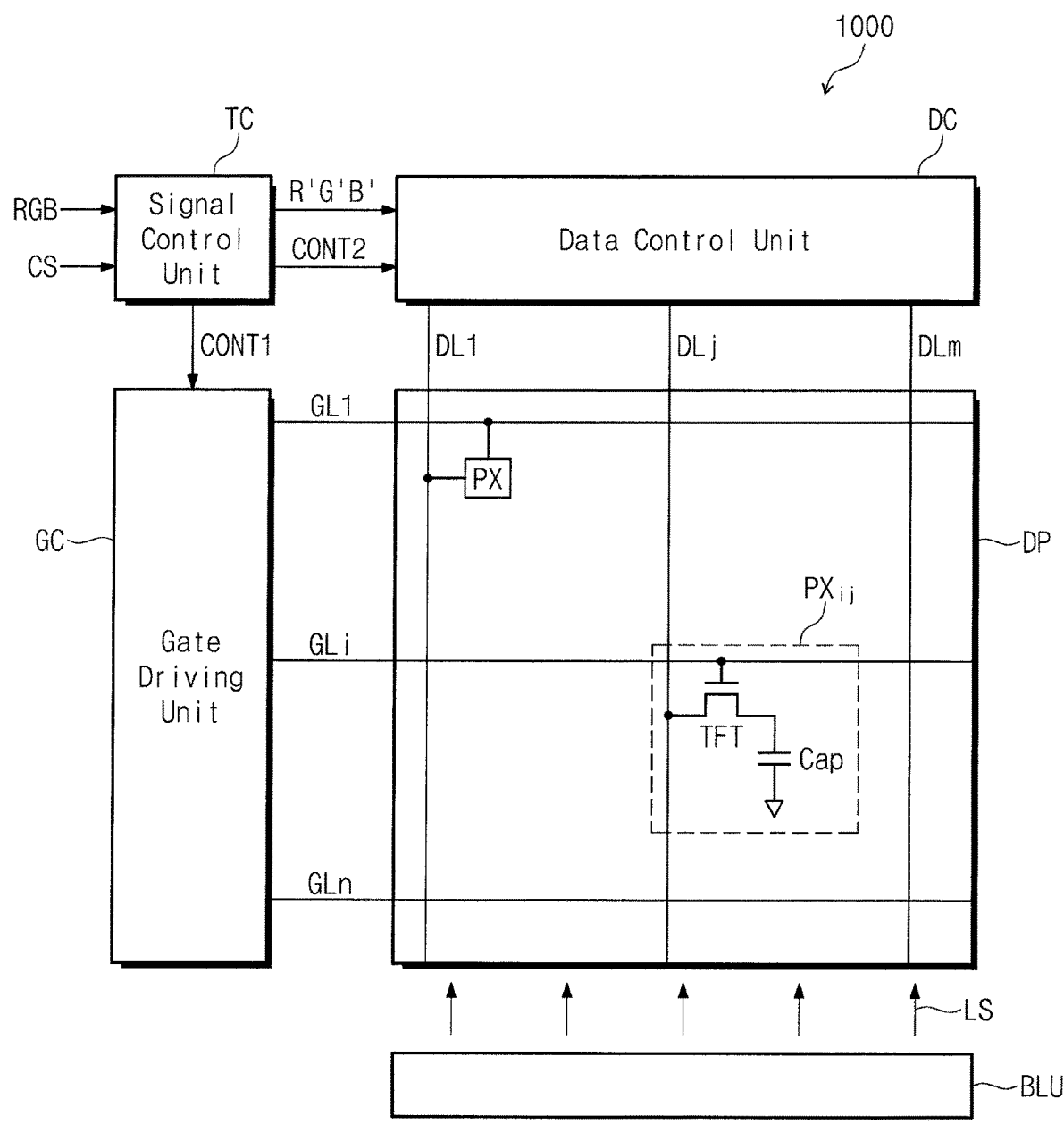
FIG. 1A is a block diagram of a display device according to an embodiment of the present disclosure.

Various modifications are possible in various embodiments of the present disclosure and certain embodiments are illustrated in drawings and related detailed descriptions are listed. However, this does not limit various embodiments of the present disclosure to a specific embodiment and it should be understood that the present disclosure covers all the modifications, equivalents, and/or replacements of this disclosure provided they come within the scope of the appended claims and their equivalents.

Like reference numerals refer to like elements throughout the drawings. In the drawings, the thickness or size of each layer may be exaggerated, omitted, or schematically illustrated for convenience in description and clarity. It will be understood that the terms "first" and "second" are used herein to describe various components but these components should not be limited by these terms. These terms are used only to distinguish one component from other components. For example, a first component may be referred to as a second component and vice versa without departing from the scope of the present disclosure. The singular expressions include plural expressions unless the context clearly dictates otherwise.

Additionally, in various embodiments of the present disclosure, the term "include," "comprise," "including," or "comprising," specifies a property, a region, a fixed number, a step, a process, an element and/or a component but does not exclude other properties, regions, fixed numbers, steps, processes, elements and/or components.

In order to achieve the above-described object, hereinafter, certain embodiments of the present disclosure will be described in more detail with reference to the accompanying drawings.

Figure 1B:
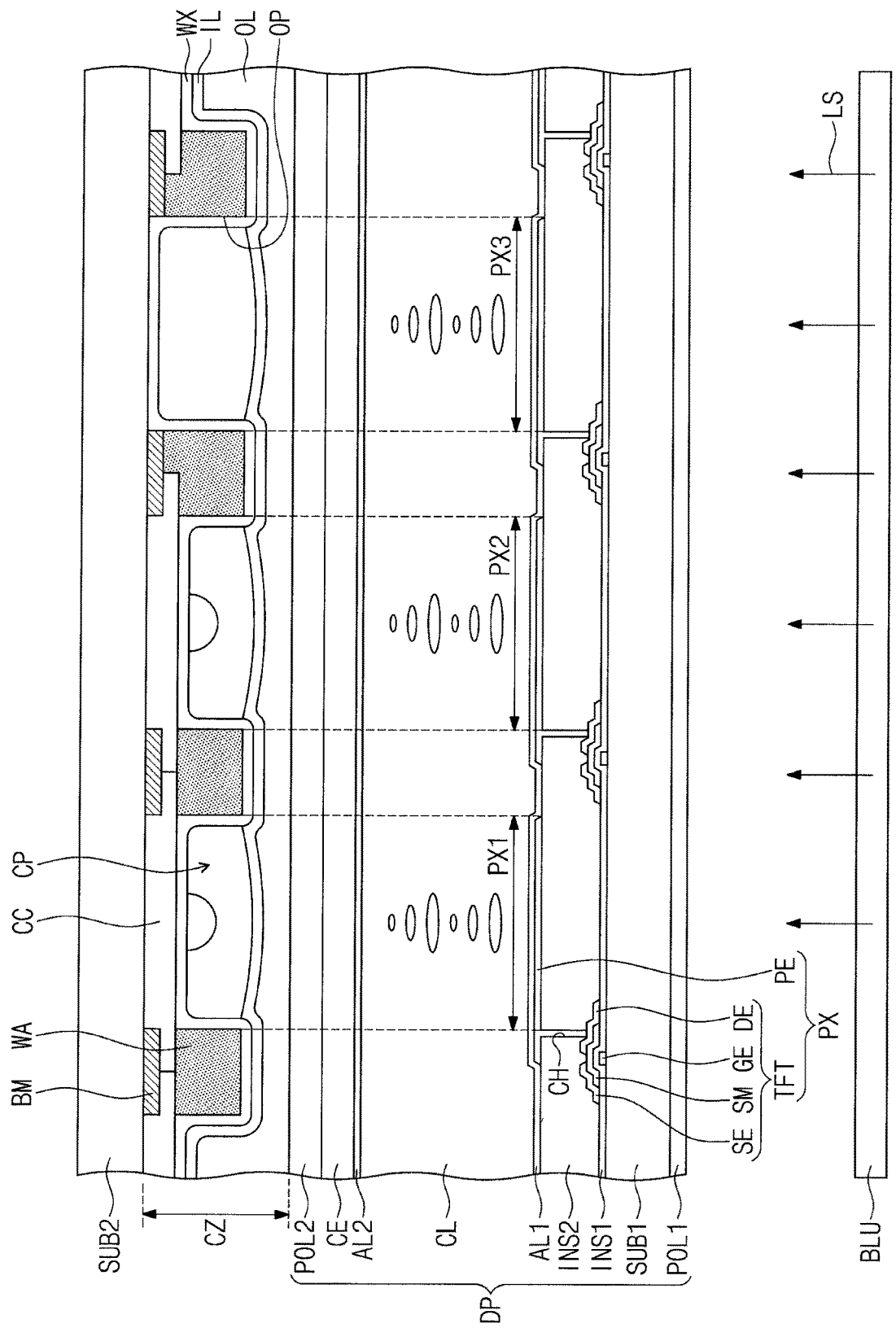
FIG. 1B is a cross-sectional view of a display device according to an embodiment of the present disclosure.

FIG. 1A is a block diagram of a display device according to an embodiment of the present disclosure. FIG. 1B is a cross-sectional view of a display device according to an embodiment of the present disclosure. A display device according to an embodiment will be described in detail with reference to FIGS. 1A-1B.

As shown in FIG. 1A, a display device 1000 according to an embodiment of the present disclosure includes a display panel DP, a signal control unit TC, a gate driving unit GC, a data driving unit DC, and a backlight unit BLU.

The display panel DP includes a plurality of signal wirings and a plurality of pixels PX coupled (or connected) to the plurality of signal wirings. The plurality of signal wirings includes a plurality of gate lines GL1 to GLn and a plurality of data lines DL1 to DLm. The plurality of gate lines GL1 to GLn are arranged in one direction of the display panel DP. The plurality of data lines DL1 to DLm intersect the plurality of gate lines GL1 to GLn insulatingly. The plurality of signal wirings may further include a plurality of common lines corresponding to the plurality of gate lines GL1 to GLn.

The plurality of pixels PX may be arranged in a matrix form. Each of the plurality of pixels PX is coupled (or connected) to the corresponding gate line GLi and data line DLj among the plurality of gate lines GL1 to GLn and the plurality of data lines DL1 to DLm.

The signal control unit TC receives input image signals RGB and converts the input image signals RGB into image data R'G'B' corresponding to the display panel DP. In addition, the signal control unit TC receives various suitable control signals CS, for example, a vertical synchronization signal, a horizontal synchronization signal, a main clock signal, and a data enable signal, and outputs first and second control signals CONT1 and CONT2.

The gate driving unit GC outputs gate signals to the plurality of gate lines GL1 to GLn in response to the first control signal CONT1. The first control signal CONT1 includes a vertical start signal for starting the operation of the gate driving unit GC, a gate clock signal for determining the output timing of the gate voltage, and an output enable signal for determining the on-pulse width of the gate voltage.

The data driving unit DC converts the second control signal CONT2 and the image data R'G'B' into data voltages and provides the data voltages to the plurality of data lines DL1 to DLm.

The second control signal CONT2 includes a horizontal start signal for starting the operation of the data driving unit DC, an inversion signal for inverting the polarities of the data voltages, and an output instruction signal for determining the timing for outputting the data voltages from the data driving unit DC.

A circuit diagram of one pixel PXij among the plurality of pixels PX is shown. Each of the plurality of pixels PX includes a transistor TFT and a liquid crystal capacitor Cap. The term "transistor TFT," as used herein, refers to a thin film transistor.

The transistor TFT is electrically coupled (or connected) to the i-th gate line GLi and the j-th data line DLj. The transistor TFT outputs a pixel voltage corresponding to the data signal received from the j-th data line DLj in response to the data signal received from the i-th gate line GLi.

The liquid crystal capacitor Cap charges the pixel voltage outputted from the transistor TFT. The arrangement of the liquid crystal molecules included in the liquid crystal layer CL (see FIG. 1B) changes depending on the amount of charge charged in the liquid crystal capacitor Cap. According to the arrangement of the liquid crystal molecules, the light incident on the liquid crystal layer CL is transmitted or blocked.

The backlight unit BLU provides light to the display panel. The light LS emitted from the backlight unit BLU has a constant wavelength band. For example, the light LS may be ultra-violet (UV) or blue light. When the light LS is emitted from the side of the backlight unit BLU, the backlight unit BLU may further include a light guide plate for guiding the light LS to one surface of the first substrate SUB1.

FIG. 1B shows only a partial configuration of the display device 1000. The display device 1000 includes a display panel DP, a color filter member CZ, and a backlight unit BLU. The display panel DP includes a first substrate SUB1, a second substrate SUB2, and a plurality of pixels PX.

The first substrate SUB1 may be a transparent insulating substrate. For example, the first substrate SUB1 may be a glass substrate or a plastic substrate. The light LS emitted from the backlight unit BLU is incident on one surface of the first substrate SUB1.

The first substrate SUB1 and the second substrate SUB2 are disposed opposite to each other and pixels PX are disposed between the first substrate SUB1 and the second substrate SUB2. Each of the plurality of pixels PX includes a transistor TFT and a liquid crystal capacitor Cap. The transistor TFT includes a gate electrode GE, a source electrode SE, a drain electrode DE, and a semiconductor pattern SM.

The liquid crystal capacitor Cap includes a pixel electrode PE coupled (or connected) to the transistor TFT, a common electrode CE facing the pixel electrode PE, and a dielectric layer disposed between the pixel electrode PE and the common electrode CE. In an embodiment of the present disclosure, the dielectric layer corresponds to a liquid crystal layer CL.

The transistor TFT includes a gate electrode GE, a semiconductor pattern SM, a source electrode SE, and a drain electrode DE. The gate electrode GE is coupled (or connected) to the corresponding gate line GLi. The gate electrode GE includes a conductive material. For example, the gate electrode GE may include at least one of a metal such as nickel (Ni), molybdenum (Mo), aluminum (Al), titanium (Ti), copper (Cu), and tungsten (W), and a metal oxide. The gate electrode GE may be a single film or a multiple film. The gate electrode GE may be made of the same (e.g., substantially the same) material as the gate lines GL1 to GLn and may have the same (e.g., substantially the same) layer structure.

The display panel DP according to an embodiment of the present disclosure may further include a first insulating film INS1. The first insulating film INS1 is disposed on the first substrate SUB1 and covers the gate electrode GE and the gate lines GL1 to GLn (see FIGS. 1A-1B). The first insulating film INS1 may include an inorganic material and may include at least one of, for example, silicon oxide (SiOx), silicon nitride (SiNx), and silicon oxynitride (SiON).

The semiconductor pattern SM is disposed on the first insulating film INS1. At least a part of the semiconductor pattern SM overlaps the gate electrode GE.

The source electrode SE and the drain electrode DE are disposed on the first insulating film INS1. One side of the source electrode SE is coupled (or connected) to the corresponding data line DLj and the other side of the source electrode SE overlaps the semiconductor pattern SM. One side of the drain electrode DE overlaps the semiconductor pattern SM and the other side of the drain electrode DE overlaps the pixel electrode PE. The other side of the source electrode SE and one side of the drain electrode DE are spaced apart from each other.

Each of the source electrode SE and the drain electrode DE includes a conductive material. For example, each of the source electrode SE and the drain electrode DE may include at least one of Ni, Cr, Mo, Al, Ti, Cu, and an alloy thereof. Each of the source electrode SE and the drain electrode DE may be a single film or a multiple film. The data line DLj may be made of the same (e.g., substantially the same) material as the source electrode SE and may have the same (e.g., substantially the same) layer structure.

The display panel DP according to an embodiment of the present disclosure may further include a second insulating film INS2. The second insulating film INS2 is disposed on the first insulating film INS1. The second insulating film INS2 covers the transistor TFT. The second insulating film INS2 includes an organic film and/or an inorganic film. The second insulating film INS2 may be a single film or a multiple film. For example, the second insulating film INS2 may include an inorganic film disposed on the transistor TFT and an organic film disposed on the inorganic film and providing a flat upper surface.

The pixel electrode PE is disposed on the second insulating film INS2. The pixel electrode PE is electrically coupled (or connected) to the drain electrode DE through a contact hole CH formed through the second insulating film INS2. The pixel electrode PE may include a transparent conductive material. For example, the pixel electrode PE may include at least one of indium oxide, gallium oxide, titanium oxide, and zinc oxide.

The pixel electrode PE electrically coupled (or connected) to the drain electrode DE through the contact hole CH receives a voltage corresponding to the data signal.

The liquid crystal layer CL includes a liquid crystal molecule having directionality. The liquid crystal molecules have various suitable arrangements according to the electric field formed according to a voltage difference between the common electrode CE and the pixel electrode PE. The amount of light passing through the liquid crystal layer CL may be controlled according to the arrangement of the liquid crystal molecules.

The display panel DP according to an embodiment of the present disclosure may further include a first alignment film AL1 and a second alignment film AL2. The first alignment film AL1 is disposed between the pixel electrode PE and the liquid crystal layer CL and the second alignment film AL2 is disposed between the liquid crystal layer CL and the common electrode CE to align the liquid crystal molecules of the crystal layer CL. The first alignment film AL1 and the second alignment film AL2 may be formed of a vertical alignment film and may include a polyamic acid, a polysiloxane, a polyimide, or the like.

The second substrate SUB2 is disposed on the color filter member CZ in opposition to the first substrate SUB1. The second substrate SUB2 may be made of the same (e.g., substantially the same) material as the first substrate SUB1.

The common electrode CE is disposed on the second alignment film AL2. As described above, the common electrode CE constitutes a liquid crystal capacitor Cap together with the pixel electrode PE. The common electrode CE may include a transparent conductive material. For example, the common electrode CE may include at least one of indium tin oxide, indium zinc oxide, indium gallium zinc oxide, fluoro zinc oxide, gallium zinc oxide, or tin oxide.

The common electrode CE according to an embodiment of the present disclosure may be disposed on the first substrate SUB1. At this time, the common electrode CE may be disposed on the same (e.g., substantially the same) layer as the pixel electrode PE, or on different layers with insulating films therebetween.

The display panel DP according to an embodiment of the present disclosure may include at least one of polarizing plates POL1 and POL2. For example, the first polarizing plate POL1 and the second polarizing plate POL2 polarize incident light from the backlight unit BLU. The first polarizing plate POL1 may face the backlight unit BLU. The second polarizing plate POL2 may be disposed between the common electrode CE and the color filter member CZ. The polarizing plates may include a plurality of patterns for polarizing incident light, or may have a laminated structure of inorganic films. For example, the polarizing plate may include a wire grid polarizer or a distributed Bragg reflector, and a polarizing film.

The color filter member CZ includes a blocking pattern member CC, a partition member WA, a liquid repellent coating layer WX, a color conversion member CP, a light blocking member BM, an inorganic film layer IL, and an organic film layer OL.

The partition member WA may be defined by a plurality of opening parts overlapping at least one of the plurality of pixels PX. The blocking pattern member CC is disposed corresponding to a plurality of opening parts. The liquid-repellent coating layer WX is disposed covering at least a portion of the partition member WA and the blocking pattern member CC. The color conversion member CP providing different light is disposed on the corresponding blocking pattern member CC. For example, the color conversion member CP is disposed overlapping each of the corresponding pixels PX1, PX2, and PX3. The inorganic film layer IL and the organic film layer OL are laminated on the liquid-repellent coating layer WX. The color filter member CZ will be described later in detail.

Figure 2A:
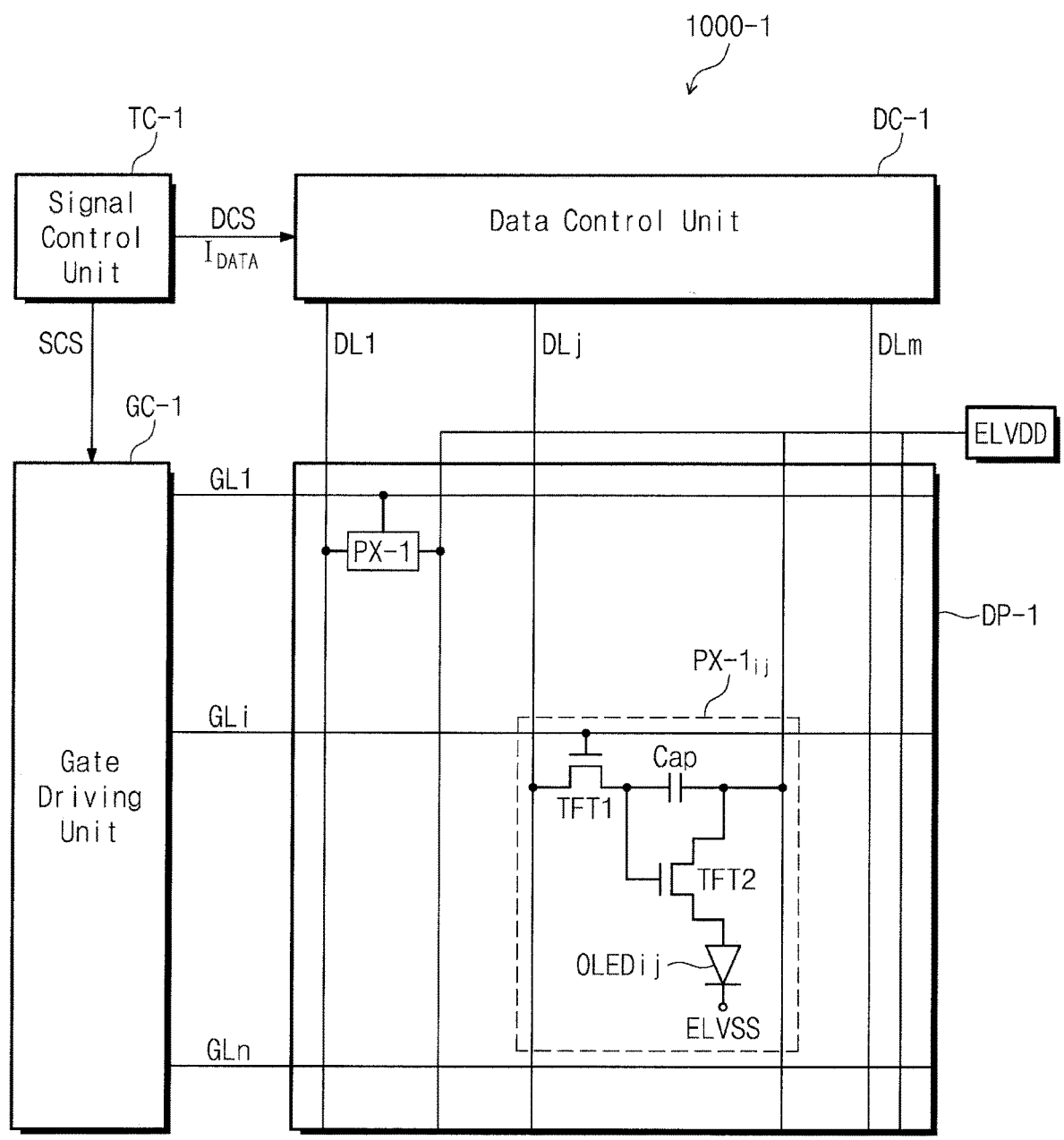
FIG. 2A is a block diagram of a display device according to an embodiment of the present disclosure.
Figure 2B:
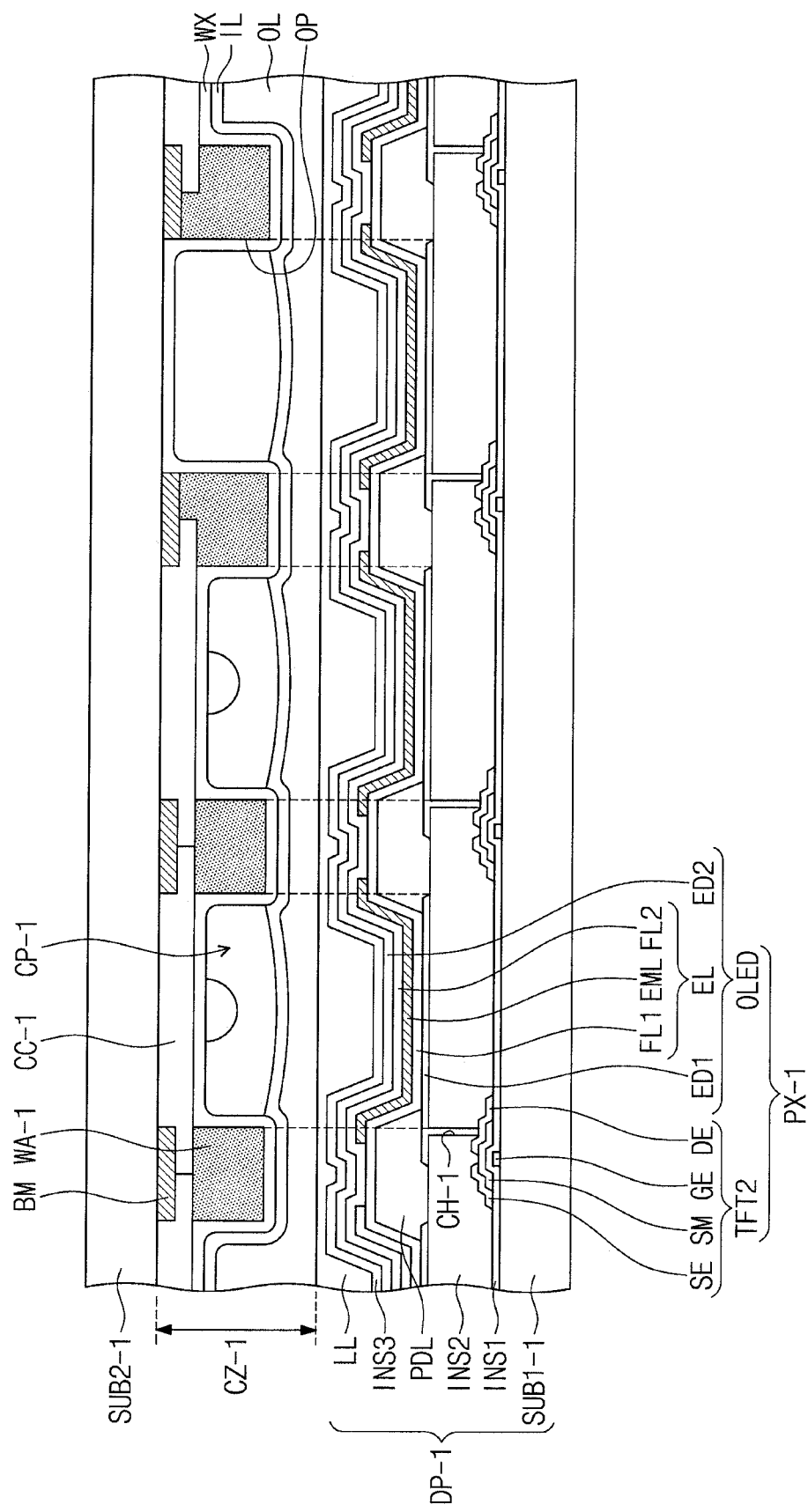
FIG. 2B is a cross-sectional view of a display device according to an embodiment of the present disclosure.

FIG. 2A is a block diagram of a display device according to an embodiment of the present disclosure. FIG. 2B is a cross-sectional view of a display device according to an embodiment of the present disclosure. According to an embodiment of the present disclosure, the color filter member described above may be used in an organic light emitting display device, and a display device according to an embodiment will be described in more detail with reference to FIGS. 2A-2B. Reference numerals similar to those of FIGS. 1A-1B are used and redundant descriptions thereof are not necessary here.

As shown in FIG. 2A, a display device 1000-1 according to an embodiment of the present disclosure includes a display panel DP-1, a signal control unit TC-1, a gate driving unit GC-1, and a data driving unit DC-1.

The signal control unit TC-1 receives input image signals and outputs image data IDATA converted to match the operation mode of the display panel DP-1 and various suitable control signals SCS and DCS.

The gate driving unit GC-1 receives the gate drive control signal SCS from the signal control unit TC-1. The gate driving unit GC-1 receiving the gate driving control signal SCS generates a plurality of gate signals. The plurality of gate signals are sequentially supplied to the display panel DP-1.

The data driving unit DC-1 receives the data driving control signal DCS and the converted image data IDATA from the signal control unit TC-1. The data driving unit DC-1 generates a plurality of data signals based on the data driving control signal DCS and the converted image data IDATA. The plurality of data signals are sequentially supplied to the display panel DP-1.

The display panel DP-1 receives the first power supply voltage ELVDD and the second power supply voltage ELVSS from the outside. Each of the plurality of pixels PX-1 is turned on in response to a corresponding gate signal.

Each of the plurality of pixels PX-1 receives the first power supply voltage ELVDD and the second power supply voltage ELVSS and generates light in response to the corresponding data signal. The first power supply voltage ELVDD is a voltage higher than the second power supply voltage ELVSS.

Each of the plurality of pixels PX-1 includes at least one transistor, at least one capacitor, and an organic light emitting element. FIG. 2A shows a circuit diagram of one pixel PX-1$ij$ coupled (or connected) to the i-th gate line Gi among the plurality of gate lines GL1 to GLn and the j-th data line DLj among the plurality of data lines DL1 to DLm, for example.

The pixel PX-1$ij$ includes a first thin film transistor TFT1, a second thin film transistor TFT2, a capacitor Cap, and an organic light emitting element OLEDij. The first thin film transistor TFT1 includes a control electrode coupled (or connected) to the i-th gate line GLi, an input electrode coupled (or connected) to the j-th data line DLj, and an output electrode. The first thin film transistor TFT1 outputs a data signal applied to the j-th data line DLj in response to a gate signal applied to the i-th gate line GLi.

The capacitor Cap includes a first capacitor electrode coupled (or connected) to the first thin film transistor TFT1 and a second capacitor electrode receiving the first power source voltage ELVDD. The capacitor Cap charges the amount of charge corresponding to the difference between the voltage corresponding to the data signal received from the first thin film transistor TFT1 and the first power source voltage ELVDD.

The second thin film transistor TFT2 includes a control electrode coupled (or connected) to the output electrode of the first thin film transistor TFT1 and the first capacitor electrode of the capacitor Cap, an input electrode receiving the first power source voltage ELVDD, and an output electrode. The output electrode of the second thin film transistor TFT2 is coupled (or connected) to the organic light emitting element OLEDij.

The second thin film transistor TFT2 controls the driving current flowing in the organic light emitting element OLEDij in correspondence to the amount of charge stored in the capacitor Cap. The turn-on time of the second thin film transistor TFT2 is determined according to the amount of charge charged in the capacitor Cap. Substantially, the output electrode of the second thin film transistor TFT2 supplies a voltage lower than the first power supply voltage ELVDD to the organic light emitting element OLEDij.

The organic light emitting element OLEDij includes a first electrode coupled (or connected) to the second thin film transistor TFT2 and a second electrode receiving the second power supply voltage ELVSS. The organic light emitting element OLEDij may include a light emission pattern disposed between the first electrode and the second electrode.

The organic light emitting element OLEDij emits light during the turn-on section of the second thin film transistor TFT2. The color of the light generated in the organic light emitting element OLEDij is determined by a substance that forms a light emission pattern. For example, the color of light generated in the organic light emitting element OLEDij may be any one of red, green, blue, and white. According to an embodiment of the present disclosure, the color of the light generated in the organic light emitting element OLEDij may be blue light.

FIG. 2B shows only a partial configuration of the display device 1000-1. For ease of explanation, only one pixel PX-1 (hereinafter referred to as a pixel) is exemplarily shown and only the second thin film transistor TFT2 and the organic light emitting element OLED in the configuration of the pixel PX-1 shown in FIG. 2 are shown exemplarily. The display panel DP-1 includes a first substrate SUB1-1, a second substrate SUB2-1, and a plurality of pixels PX-1.

The plurality of pixels PX-1 include a second thin film transistor TFT2 and an organic light emitting element OLED electrically coupled (or connected) to the drain electrode DE of the second thin film transistor TFT2. The drain electrode DE is electrically coupled (or connected) to the second thin film transistor TFT2 through the contact hole CH-1.

The organic light emitting element OLED includes a first electrode layer ED1, an organic layer EL, and a second electrode layer ED2. The first electrode layer ED1 is disposed on the second insulating film INS2.

The first electrode layer ED1 may be an anode electrode. The first electrode layer ED1 may be formed of a material having a high work function to facilitate hole injection.

The first electrode layer ED1 includes a conductive material. The first electrode layer ED1 may be a reflective electrode, a semi-transmissive electrode, or a transmissive electrode. The first electrode layer ED1 may be a single layer or a multilayer.

A pixel definition film PDL may be disposed on the second insulating film INS2. The pixel definition film PDL may be disposed on a plane, overlapping the first electrode layer ED1 and the partition member WA.

The organic layer EL is disposed on the first electrode layer ED1. The organic layer EL includes emission patterns, a hole transporting region FL1 (or hole control layer), and an electron transporting region FL2 (or an electron control layer). FIG. 2B shows a light emission pattern EML disposed in one region. The light emission pattern EML overlaps the color conversion member CP-1.

The light emission pattern EML may be composed of at least one of materials emitting red, green, and blue light, and may include a fluorescent material or a phosphorescent material. For example, the light emission pattern EML according to an embodiment of the present disclosure may be composed of a substance emitting blue light.

In addition, the light emission pattern EML may include a host material and a dopant material. Each of the host material and the dopant material may include any suitable host and dopant available in the art.

The hole transporting region FL1 is a region through which the hole injected from the first electrode layer ED1 passes to reach the light emission pattern EML. The hole transporting region FL1 may include at least one of a hole injecting layer, a hole transporting layer, and a single layer having both a hole injecting function and a hole transporting function.

The hole transporting region FL1 may be composed of at least one of a hole injecting material and a hole transporting material. The hole injecting material and the hole transporting material may be any suitable materials available in the art, respectively.

On the other hand, the hole transporting region FL1 may further include a hole blocking layer. When including a hole blocking layer, the hole transporting region FL1 may include any suitable hole blocking material available in the art.

On the other hand, the hole transporting region FL1 may further include a charge generating material. The charge generating material may be uniformly (e.g., substantially uniformly) dispersed in the hole transporting region FL1 to form one single region or may be non-uniformly dispersed to divide the hole transporting region FL1 into a plurality of regions.

The electron transporting region FL2 is defined between the light emission pattern EML and the second electrode layer ED2. The electron transporting region FL2 is a region through which the electron injected from the electron electrode layer ED2 passes to reach the light emission pattern EML.

The electron transporting region FL2 may include at least one of a hole blocking layer, an electron transporting layer, and an electron injecting layer, but is not limited thereto. For example, the electron transporting region FL2 may have a structure of an electron transporting layer/electron injecting layer or a hole blocking layer/electron transporting layer/electron injecting layer, which are sequentially stacked from the light emission pattern EML, or may have a single layer structure where two or more layers are mixed, but the present disclosure is not limited thereto.

The electron transporting region FL2 may include at least one of an electron transporting material and an electron injecting material. The electron injecting material and the electron transporting material may be any suitable materials available in the art, respectively.

The second electrode layer ED2 is disposed on the first electrode layer ED1. And the second electrode layer ED2 receives the second power supply voltage ELVSS. The second electrode layer ED2 faces the first electrode layer ED1. For example, when the first electrode layer ED1 is an anode electrode, the second electrode layer ED2 may be a cathode electrode. Accordingly, the second electrode layer ED2 may be formed of a material having a low work function to facilitate electron injection. However, this is exemplarily described, and the second electrode layer ED2 includes a material having a higher work function than the first electrode layer ED1 and may be an anode electrode facing the first electrode layer ED1 and is not limited to any an embodiment.

The second electrode layer ED2 includes a conductive material. The conductive material may be a metal, an alloy, an electrically conductive compound, and a mixture thereof. The second electrode layer ED2 may include at least one of a reflective material and a transmissive material.

The second electrode layer ED2 may be a single layer or a multilayer. The multilayer may include at least one of a layer composed of a reflective material and a layer composed of a transmissive material.

The second electrode layer ED2 may be a reflective, semi-transmissive, or transmissive electrode. The second electrode layer ED2 is not limited to any an embodiment, and may be formed of various suitable materials depending on the structure of the organic light emitting element OLED. The second electrode layer ED2 overlaps the first electrode layer ED1 and the pixel definition film PDL, respectively.

A third insulating film INS3 is disposed on the second electrode layer ED2. The third insulating film INS3 is disposed on the second electrode layer ED2 to insulate the second electrode layer ED2 and other structures disposed on the second electrode layer ED2. In addition, the third insulating film INS3 may prevent moisture and/or oxygen from penetrating into the organic light emitting element OLED (or may reduce a likelihood or amount of such penetration of moisture and/or oxygen).

A planarization layer LL is disposed on the third insulating film INS3. One side of the planarization layer LL is in contact with the third insulating film INS3 and the other side is in contact with the organic film layer OL of the color filter member CZ-1 to provide a flat surface.

The color filter member CZ-1 is disposed on the planarization layer LL and overlaps with the organic light emitting element OLED. For example, the light emission pattern EML and the color conversion member CP-1 may be overlapped so as to correspond to each other. According to an embodiment of the present disclosure, the light emission pattern EML may be composed of a substance emitting blue light, and the blue light generated from the organic light emitting element OLED may be provided to the color filter member CZ-1. The color filter member CZ-1 may emit red light or green light in response to blue light. The color filter member CZ-1 is the same (e.g., substantially the same) as the configuration described with reference to FIG. 1B, and a detailed description thereof will be made later.

Figure 3A:
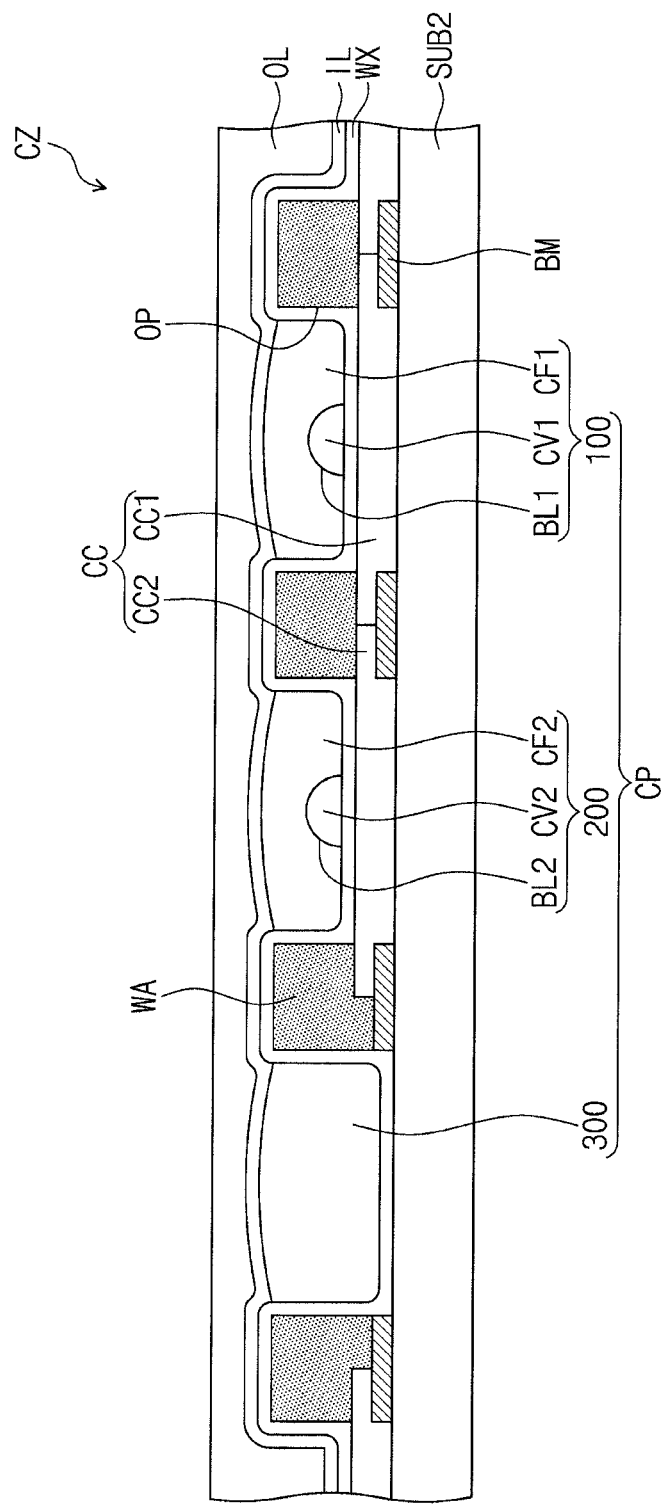
FIGS. 3A-3C are cross-sectional views of a color filter member according to one embodiment of the present disclosure.
Figure 3B:
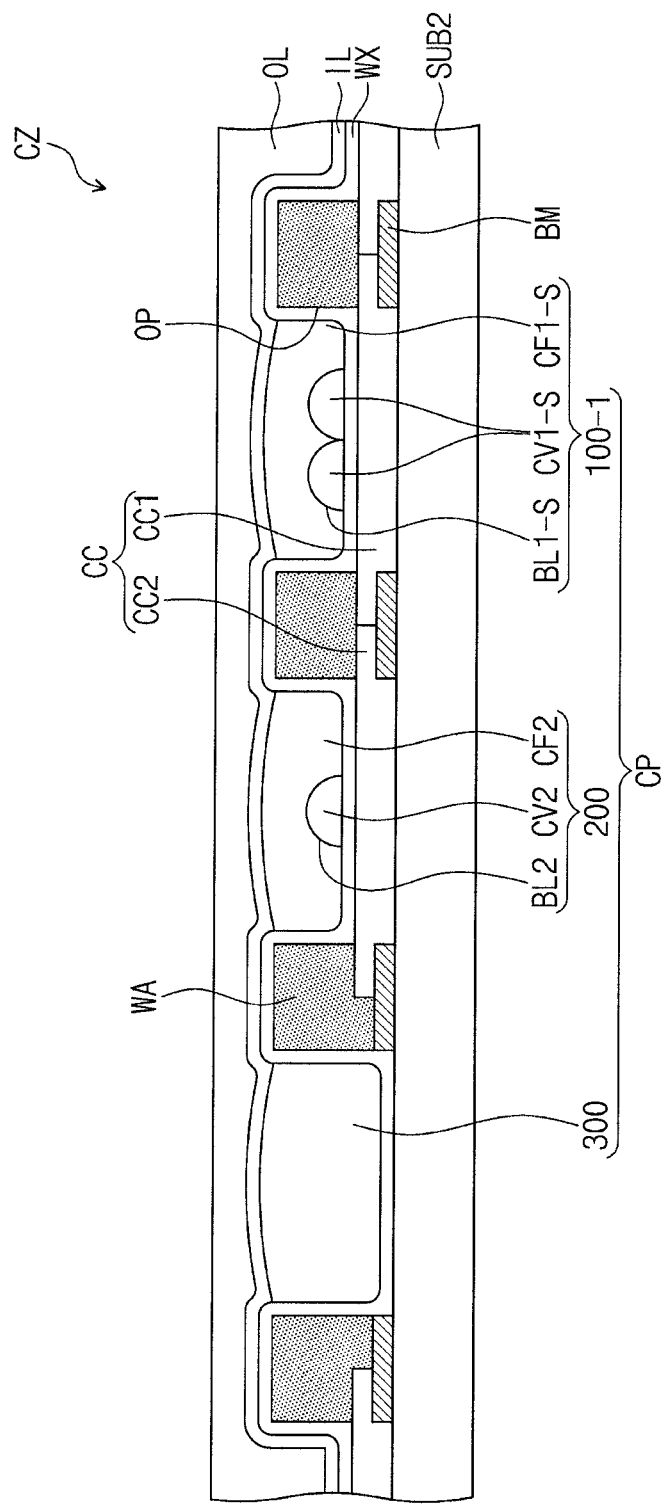
Figure 3C:
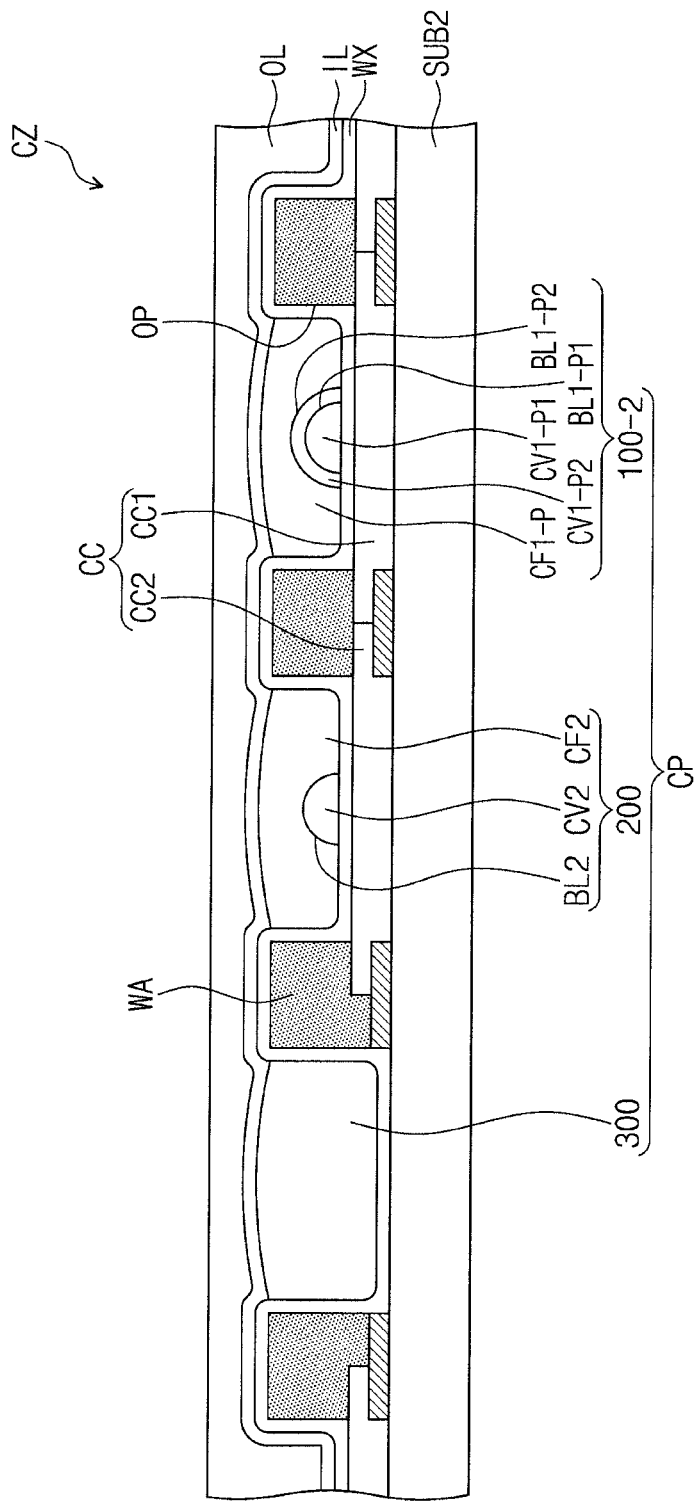

FIGS. 3A-3C are cross-sectional views of a color filter member according to an embodiment of the present disclosure. For convenience of explanation, only the configuration related to the color filter member CZ, which is an embodiment of the present disclosure, will be described separately.

Referring to FIG. 3A, the color filter member CZ according to an embodiment of the present disclosure includes a blocking pattern member CC, a partition member WA, a liquid repellent coating layer WX, a color conversion member CP, a light blocking member BM, an inorganic film layer IL, and an organic film layer OL.

The color conversion member CP may include a first color conversion pattern 100, a second color conversion pattern 200, and a third color conversion pattern 300.

The blocking pattern member CC is disposed on the second substrate SUB2. The blocking pattern member CC includes a first color blocking pattern CC1 overlapping the first color conversion pattern 100 and a second color blocking pattern CC2 overlapping the second color conversion pattern 200.

The blocking pattern member CC may prevent (or reduce) the occurrence of color mixture in the process of implementing red or green color as the light emitted from the backlight unit BLU, for example, blue light, passes through the first color conversion pattern 100 and the second color conversion pattern 200. For example, the blocking pattern member CC may block blue light by absorbing the light of the blue light wavelength band (400 nm to 500 nm). The blocking pattern member CC may include an inorganic material having a high refractive index and a low refractive index in a single layer, and may be formed of a plurality of layers where an inorganic material having a high refractive index and a low refractive index is repeatedly laminated. The blocking pattern member CC may include silicon oxide (SiOx) and silicon nitride (SiNx) as inorganic materials having a high refractive index and a low refractive index. Since the blocking pattern member CC selectively transmits light emitted from the inside, the color reproducibility of the color filter member CZ may be improved.

The partition member WA is disposed on the second substrate SUB2 to define a plurality of opening parts. The partition member WA has insulating property. In addition, a light absorbing material may be included to prevent (or reduce) color mixing between the plurality of pixels PX.

The liquid-repellent coating layer WX covers the partition member WA. The liquid-repellent coating layer WX is placed on the blocking pattern member CC to cover the partition member WA and the parts exposed by of the partition member WA of the blocking pattern member CC. The liquid-repellent coating layer WX provides liquid repellence to the surface where the color conversion member CP described later is disposed. The liquid-repellent coating layer WX may include at least one of silicon and fluorine. For example, it may be a fluorine-containing coating agent, a silane coupling agent, a gelling agent, or a silica-based coating agent, but if it is a general water repellent coating method, is not limited thereto.

The color conversion member CP is disposed in the partition opening part OP by the partition member WA on the second substrate SUB2. The color conversion member CP overlaps at least one pixel of the plurality of pixels PX and is disposed directly on the liquid repellent coating layer WX. Each of the first color conversion pattern 100 and the second color conversion pattern 200 is correspondingly disposed on the corresponding blocking pattern member CC.

The first color conversion pattern 100 includes a first bent part CV1 and a first color conversion part CF1. A region where the first bent part CV1 and the first color conversion part CF1 directly overlap is defined as a first interfacial surface BL1.

The second color conversion pattern 200 includes a second bent part CV2 and a second color conversion part CF2. A region where the second bent part CV2 and the second color conversion part CF2 directly overlap is defined as a second interfacial surface BL2.

Interfacial surfaces have a curved surface. For example, the interfacial surfaces may have a semi-spherical shape due to the liquid-repellence of the liquid-repellent coating layer WX, or a shape in which at least a part of the spherical shape is removed.

Each of the first color conversion pattern 100 and the second color conversion pattern 200 according to an embodiment of the present disclosure may include a plurality of fluorescent substances or a plurality of quantum dots which are converted into different lights. For example, the first color conversion pattern 100 may include a plurality of fluorescent substances that absorb blue light emitted from the backlight unit BLU (see FIG. 1B) and emit red light. The red fluorescent substance may be at least one of (Ca, Sr, Ba)S, $(Ca, Sr, Ba)_2Si_5N_8$, $CaZSiN_3$, $CaMoO_4$, and $Eu_2Si_5N_8$. The second color conversion pattern 200 may include fluorescent substances that absorb blue light emitted from the backlight unit BLU and emit green light. For example, the green fluorescent substances may be at least one of yttrium aluminum garnet (YAG), $(Ca, Sr, Ba)_2SiO_4$, $SrGa_2S_4$, BAM, α-SiAlON, β-SiAlON, $Ca_3Sc_2Si_3O_{12}$, $Tb_3Al_5O_{12}$, $BaSiO_4$, CaAlSiON, and $(Sr1-xBax)Si_2O_2N_2$.

In addition, when each of the first color conversion pattern 100 and the second color conversion pattern 200 includes a plurality of quantum dots for converting light, the quantum dots may include Group II-VI compounds, Group IV-VI compounds, Group IV Elements, Group IV compounds, and combinations thereof. The Group VI compound may be selected from bivalent element compounds selected from the group consisting of CdSe, CdTe, ZnS, ZnSe, ZnTe, ZnO, HgS, HgSe, HgTe, MgSe, MgS, and mixtures thereof; trivalent element compounds selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and tetravalent element compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof. The Group III-V compound may be selected from bivalent element compounds selected from the group consisting of GaN, GaP, GaAs, GaSb, AlN, AlP, AlAs, AlSb, InN, InP, InAs, InSb, and mixtures thereof; trivalent element compounds selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and mixtures thereof; and tetravalent element compounds selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. The Group III-V compound may be selected from bivalent element compounds selected from the group consisting of SnS, SnSe, SnTe, PbS, PbSe, PbTe, and mixtures thereof; trivalent element compounds selected from the group consisting of SnSeS, SnSeTe, SnSTe, PbSeS, PbSeTe, PbSTe, SnPbS, SnPbSe, SnPbTe, and mixtures thereof; and tetravalent element compounds selected from the group consisting of SnPbSSe, SnPbSeTe, SnPbSTe, and mixtures thereof. The Group IV elements may be selected from the group consisting of Si, Ge, and mixtures thereof. The IV group compound may be a bivalent element compound selected from the group consisting of SiC, SiGe, and mixtures thereof. In addition, the form of quantum dots is not particularly limited to a form generally used in the corresponding field. For example, spherical, pyramidal, multi-arm, or cubic nanoparticles, nanotubes, nanowires, nanofibers, and nano plate-shaped particles may be used.

The first bent part CV1 is disposed on the liquid-repellent coating layer WX corresponding to the first color blocking pattern CC1. The first bent part CV1 consists of quantum dots or fluorescent substances described above. The wetting property of the first bent part CV1 is lowered by the liquid repellent coating layer WX, and the contact angle between the liquid repellent coating layer WX and the first bent part CV1 becomes larger. For example, the first bent part CV1 may have a curved shape on the liquid-repellent coating layer WX because the surface tension is increased by the liquid-repellent coating layer WX. The first bent part CV1 may have a shape that forms a low contact area with the liquid-repellent coating layer WX. Accordingly, the first bent part CV1 may have a hemispherical shape or a shape in which at least a part of the spherical shape is removed. In addition, the first interfacial surface BL1, where the first bent part CV1 and the first color conversion part CF1 contact, may have a convex curved surface toward the first substrate.

The first color conversion part CF1 may cover the first bent part CV1 and may be disposed in the corresponding opening part OP. The first color conversion part CF1 is made of the same (e.g., substantially the same) material as the first bent part CV1. Thus, the first color conversion part CF1 may have a lower surface tension when formed on the first bent part CV1 than when formed on the liquid-repellent coating layer WX. Accordingly, the first color conversion part may be easily filled in the opening part OP and have a desired shape.

The first interfacial surface BL1 may mean a surface formed due to a filling time difference during the process of forming the first color conversion part CF1 after dropping and then curing the first bent part CV1 in a manufacturing process to be described later. The shape of the first interfacial surface BL1 has the same (e.g., substantially the same) curved shape as the outer surface shape of the first oscillation locating portion CV1.

The description of the first color conversion part CF1, the first bent part CV1, and the first interfacial surface BL1 of the first color conversion pattern 100 is the same (e.g., substantially the same) as that of the second color conversion part CF2, the second bent part CV2, and the second interfacial surface BL2 of the second color conversion pattern 200, and they have the same (e.g., substantially the same) effects. Therefore, redundant explanations thereof are not necessary here.

According to an embodiment of the present disclosure, in the process of filling quantum dots or fluorescent substances that convert light emitted from the backlight unit BLU to a different light for a corresponding opening part OP, the bent parts having the same (e.g., substantially the same) material as the color conversion parts are arranged first. Thus, when a single process is used to fill quantum dots or fluorescent substances in the liquid-repellent coating layer WX, in order to overcome the not-fill phenomenon caused by the accumulation of quantum dots or fluorescent substances due to an increase in surface tension, it is possible to prevent (or reduce) an overflow phenomenon that occurs when the liquid is filled a plurality of times, thereby improving the color reproducibility of the display device 1000.

In the third color conversion pattern 300, the blue light supplied from the backlight unit (BLU) is transmitted as it is and the blue color is displayed. The third color conversion pattern 300 corresponding to a region emitting blue light may include a material emitting incident blue light without additional fluorescent substances or quantum dots. The third color conversion pattern 300 may include at least one of a scattering material, for example, a polymer such as titanium oxide (TiO2) and a photosensitive resin, or a blue dye. However, if the third color conversion pattern 300 is a material that scatters and does not convert blue light, it may be variously modified without being limited thereto.

The inorganic film layer IL covers the color filter member CZ and the partition member WA. The inorganic film layer IL may include at least one of silicon oxide (SiOx) and silicon nitride (SiNx). The inorganic film layer IL prevents (or reduces) oxygen/moisture inflow to the color filter member CZ.

The organic film layer OL is disposed on the inorganic film layer IL. The organic film layer OL includes at least one of polyimide, polyethylene terephthalate, polycarbonate, epoxy, polyethylene, and polyacrylate, and may be a single film or a laminated film. One side of the organic film layer OL overlaps the inorganic film layer IL, and the back side overlaps the common electrode CE to provide the planarization of the color filter member CZ.

The color filter member CZ according to an embodiment of the present disclosure may further include a light blocking member BM.

The light blocking member BM may be disposed on the second substrate SUB2. In relation to the light blocking member BM, at least a part of the partition member WA may be disposed with the same (e.g., substantially the same) form on the plane. The light blocking member BM absorbs the light incident on the light blocking member BM. Therefore, the light blocking member BM is made of a material that does not transmit light, such as metal particles of chromium (Cr), silver (Ag), molybdenum (Mo), nickel (Ni), titanium (Ti), and tantalum (Ta), oxides of the metal particles, or organic materials. The light blocking member BM prevents (or reduces) light scattering of the display device 1000 and improves the contrast.

Referring to FIG. 3B, a plurality of bent parts CV1-S may be disposed in a single opening part OP. For example, the first color conversion pattern 100-1 may be provided in plurality and include a plurality of bent portions CV1-S arranged on a plane. The plurality of bent parts CV1-S are disposed in contact with each other. However, this is illustratively shown, and the plurality of bent parts CV1-S may be disposed apart from each other in a single opening part OP at set (e.g., predetermined) intervals.

In addition, the plurality of bent parts CV1-S may be made of the same (e.g., substantially the same) quantum dots or fluorescent substances. The plurality of bent parts CV1-S are covered by the first color conversion part CF1-S. A region where the plurality of bent parts CV1-S and the first color conversion part CF1-S directly overlap is defined as a first interfacial surface BL1-S. The first color conversion part CF1-S may be made of the same (e.g., substantially the same) quantum dots or fluorescent substances as the plurality of bent parts CV1-S.

Referring to FIG. 3C, a plurality of bent parts may be stacked on each other on a cross section. For example, the first color conversion pattern 100-2 includes a first sub-bent part CV1-P1 and a second sub-bent part CV1-P2. The first sub-bent part CV1-P1 and the second sub-bent part CV1-P2 contact each other in the corresponding opening part OP. The first sub-bent part CV1-P1 and the second sub-bent part CV1-P2 are stacked in the thickness direction of the color filter member CZ. The first sub-bent part CV1-P1 and the second sub-bent part CV1-P2 may be made of the same (e.g., substantially the same) quantum dots or fluorescent substances. The first sub-bent part CV1-P1 and the second sub-bent part CV1-P2 are covered by the first color conversion part CF1-P. The portion where the first sub-bent part CV1-P1 and the second sub-bent part CV1-P2 contact directly forms a first interfacial surface BL1-P1 and the portion where the second sub-bent part CV1-P2 and the first color conversion part CF1-P overlap directly form a second interfacial surface BL1-P2. The first color conversion part CF1-P may be composed of the same (e.g., substantially the same) quantum dots or fluorescent substances as the first sub-bent part CV1-P1 and the second sub-bent part CV1-P2.

As shown in FIGS. 3A-3B, by increasing the area of the bent parts covered by the first color conversion part CF1-S or CF1-P or by increasing the number, the contact area between the first color conversion part CF1-S or CF1-P and the bent part is increased. Thus, when a single process is used to fill quantum dots or fluorescent substances in the liquid-repellent coating layer WX, in order to overcome the not-fill phenomenon caused by the accumulation of quantum dots or fluorescent substances due to an increase in surface tension, it is possible to prevent (or reduce) an overflow phenomenon that occurs when the liquid is filled a plurality of times, thereby improving the color reproducibility of the display device 1000.

Figure 4:
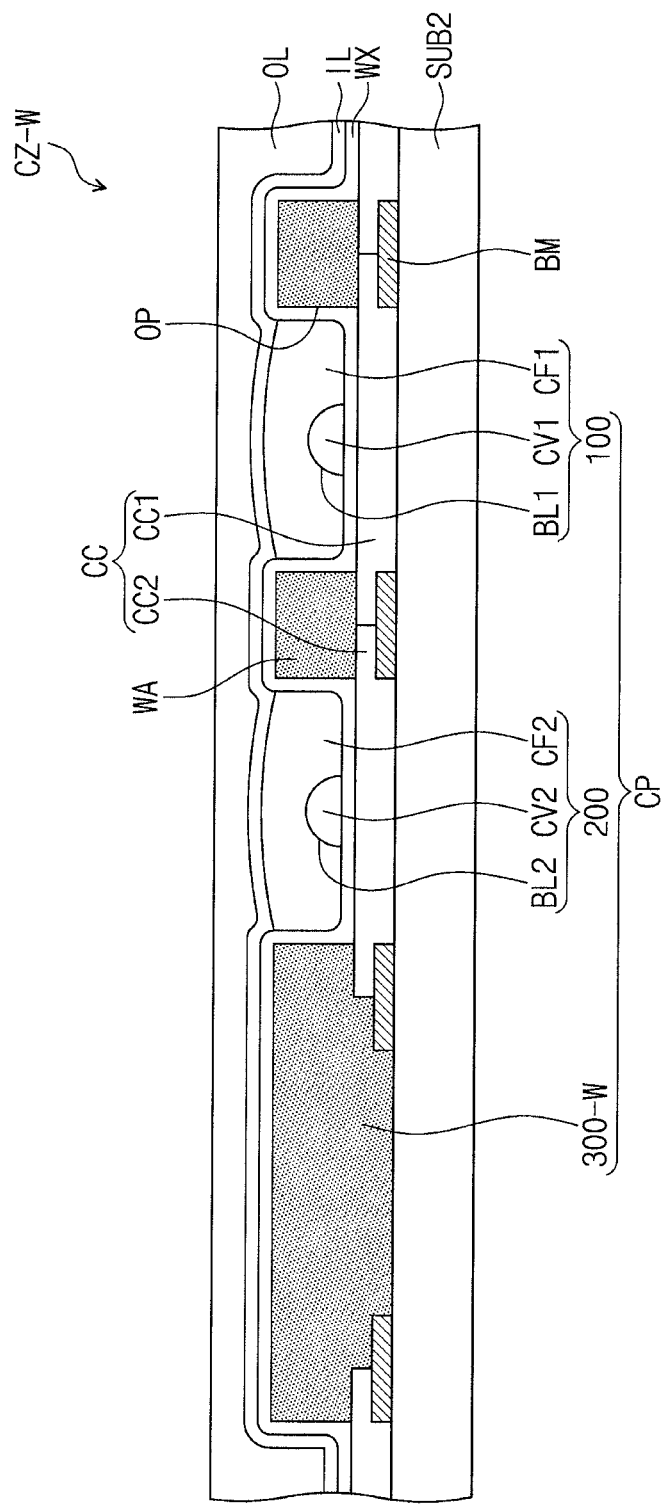
FIG. 4 is a cross-sectional view of a color filter member according to an embodiment of the present disclosure.

FIG. 4 is a cross-sectional view of a color filter member according to an embodiment of the present disclosure. Reference numerals similar to those of the color filter member CZ shown in FIG. 3A are used and redundant descriptions thereof are not necessary here.

The third color conversion pattern 300-W of the color filter member CZ-W may be made of the same (e.g., substantially the same) material as the partition member WA. The third color conversion pattern 300-W may be formed integrally with the partition member WA (see FIG. 2) defining the opening part OP overlapping with the third pixel PX3 (see FIG. 1B). Accordingly, the third color conversion pattern 300-W may correspond to the integrally-formed partition member WA (see FIG. 3A) and third color conversion pattern 300-1 (see FIG. 3A). One side of the third color conversion pattern 300-W may be in contact with the second substrate, and the backside may be covered by the liquid-repellent coating layer WX. The third color conversion pattern 300-W may include at least one of a scattering material, for example, a polymer such as titanium oxide (TiO2) and a photosensitive resin, or a blue dye. By integrally forming the partition member WA overlapping with the third color conversion pattern 300-W, it is possible to reduce the processing time and cost required for forming the opening parts of the partition member WA.

Figure 5:
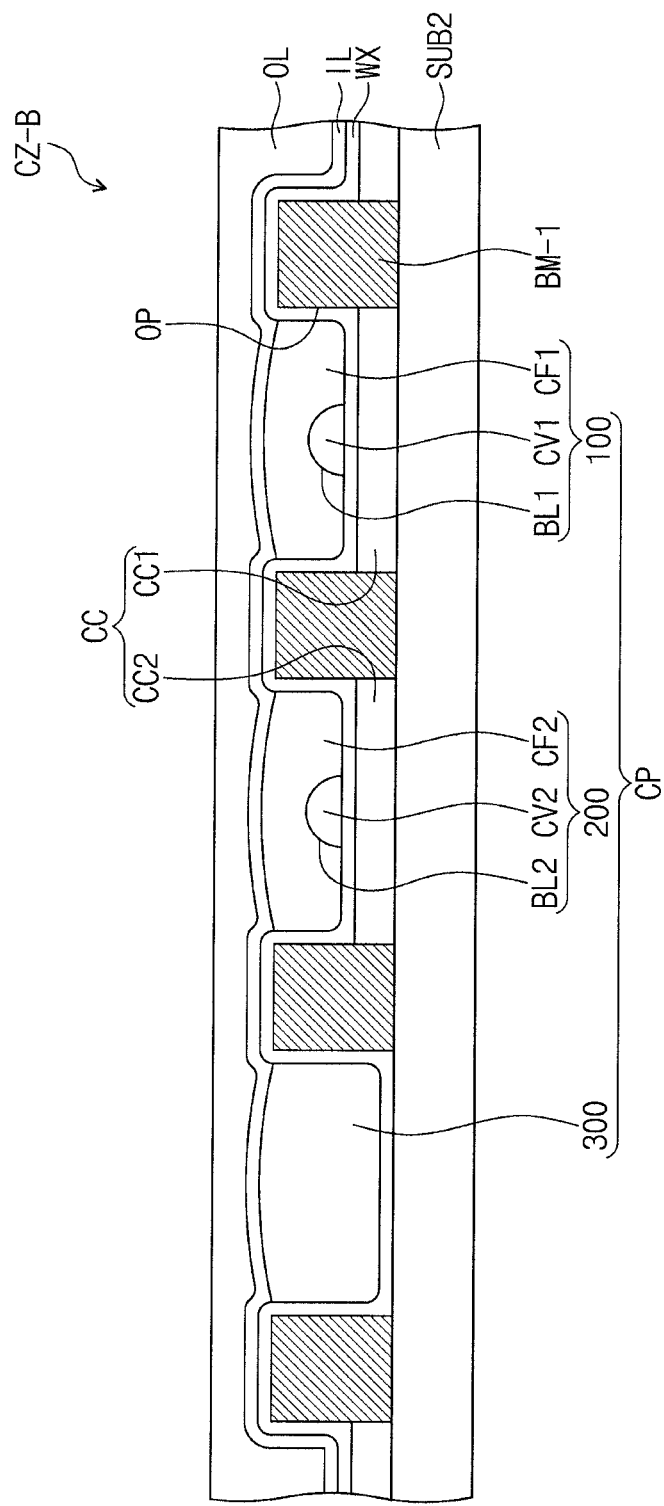
FIG. 5 is a cross-sectional view of a color filter member according to an embodiment of the present disclosure.

FIG. 5 is a cross-sectional view of a color filter member according to an embodiment of the present disclosure. Reference numerals similar to those of the color filter member CZ shown in FIG. 3A are used and redundant descriptions thereof are not necessary here.

The light blocking member BM of the color filter member CZ-B may have the same (e.g., substantially the same) shape as the partition member WA (see FIG. 3A). Accordingly, the light blocking member BM-1 may correspond to the integrally-formed partition member WA (see FIG. 3A) and light blocking member BM (see FIG. 3A). The light blocking member BM-1 prevents (or reduces) color mixing of the different opening parts and absorbs the light incident on the light blocking member BM-1. The light blocking member BM-1 is made of a material that does not transmit light, such as metal particles of chromium (Cr), silver (Ag), molybdenum (Mo), nickel (Ni), titanium (Ti), and tantalum (Ta), oxides of the metal particles, or organic materials. The light blocking member BM-1 prevents (or reduces) light scattering of the display device 1000 and improves the contrast. Also, by replacing the light blocking member BM-1 with the partition member WA of FIG. 3A, the process time and cost of forming the partition member WA of FIG. 3A may be reduced.

Figure 6:
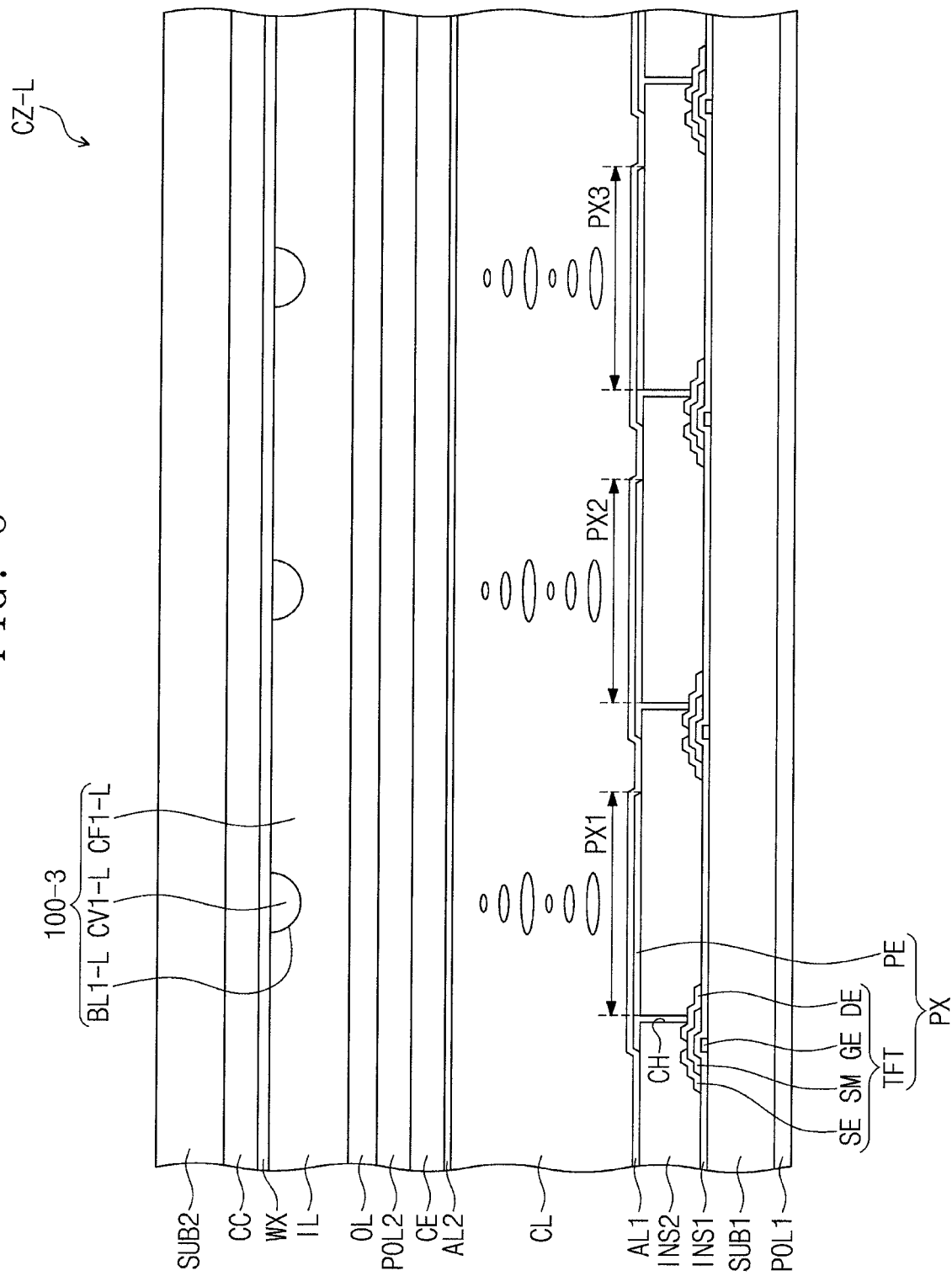
FIG. 6 is a cross-sectional view of a display device according to an embodiment of the present disclosure.

FIG. 6 is a cross-sectional view of a display device according to an embodiment of the present disclosure. Reference numerals similar to those of the color filter member CZ shown in FIG. 3A are used and redundant descriptions thereof are not necessary here.

The first color conversion pattern 100-3 of the color filter member CZ-L may be superimposed on at least two pixels PX of the plurality of pixels PX. Accordingly, the overlapping pixels PX corresponding to the first color conversion pattern 100-3 of the adjacent pixels PX provide light of the same (e.g., substantially the same) color through the first color conversion pattern 100-3.

The first color conversion pattern 100-3 includes a plurality of bent parts CV1-L. The plurality of bent parts CV1-L are disposed apart from each other and have the same (e.g., substantially the same) quantum dots or fluorescent substances. The plurality of bent parts CV1-L are covered by the first color conversion part CF1-L. A region where the plurality of bent parts CV1-L and the first color conversion part CF1-L directly overlap is defined as a first interfacial surface BL1-S. The embodiment of the present disclosure shows only the first color conversion part CF1-L, but adjacent color conversion parts may also have the same (e.g., substantially the same) shape.

FIGS. 7A-7H illustrate a method of manufacturing a display device according to an embodiment of the present disclosure. This will be described with reference to FIGS. 7A-7H. Reference numerals similar to those of the color filter member CZ shown in FIG. 3A are used and redundant descriptions thereof are not necessary here.

Figure 7A:
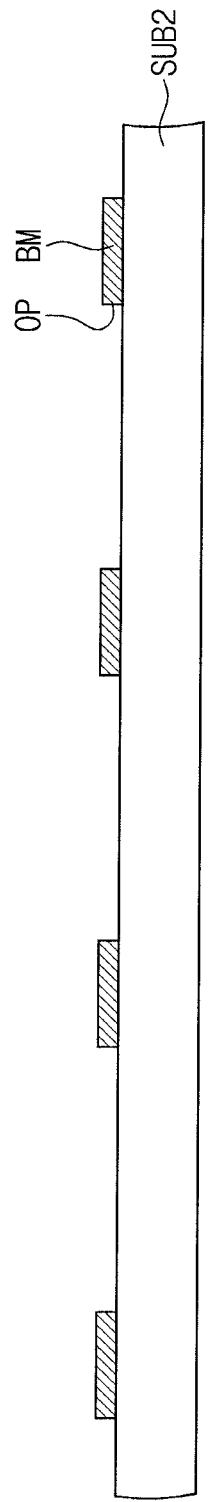
FIGS. 7A-7H illustrate a method of manufacturing a display device according to an embodiment of the present disclosure.

As shown in FIG. 7A, the light blocking member BM may be disposed on the upper surface of the second substrate SUB2.

The light blocking member BM forms a plurality of opening parts. After metal particles such as chromium (Cr), silver (Ag), molybdenum (Mo), nickel (Ni), titanium (Ti), and tantalum (Ta), oxides of the metal particles, or organic materials are applied on the entire surface of the second substrate SUB2 and selectively exposed through a photolithography method using a set (e.g., predetermined) mask, the light blocking member BM defining opening parts is formed.

Figure 7B:
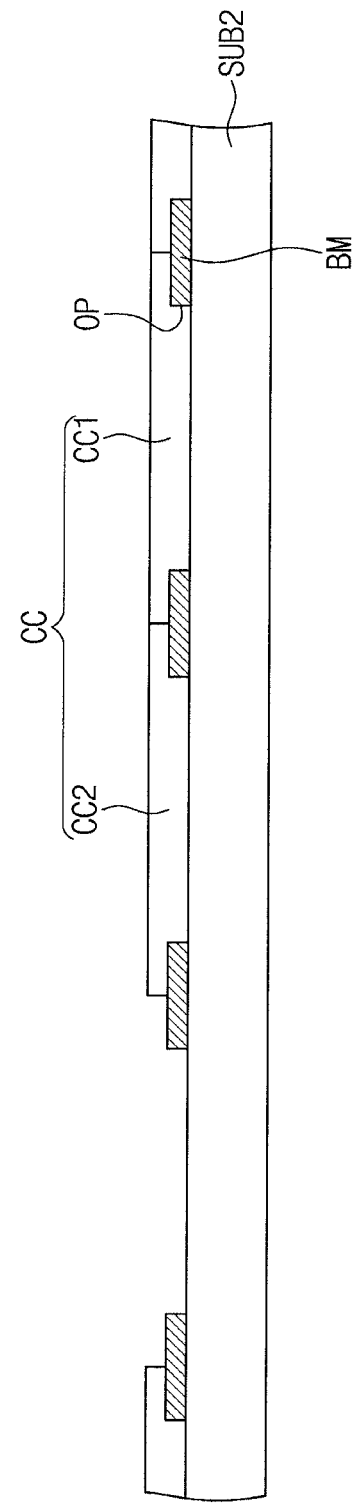

Thereafter, as shown in FIG. 7B, the blocking pattern member CC is formed on the second substrate SUB2 where the light blocking member BM is formed. It is formed in the corresponding opening part OP among the plurality of opening parts defined by the light blocking member BM and covers at least a part of the light blocking member BM. The blocking pattern member CC is formed by printing silicon oxide (SiOx) and silicon nitride (SiNx) having high refractive index and low refractive index on the entire surface and then printing the blocking pattern member CC. For example, the blocking pattern member CC may block blue light by absorbing the light of the blue light wavelength band (400 nm to 500 nm). The blocking pattern member CC is formed only at a position corresponding to the first color conversion pattern 100 and the second color conversion pattern 200 to be formed later and is not formed at a position corresponding to the third color conversion pattern 300.

Figure 7C:
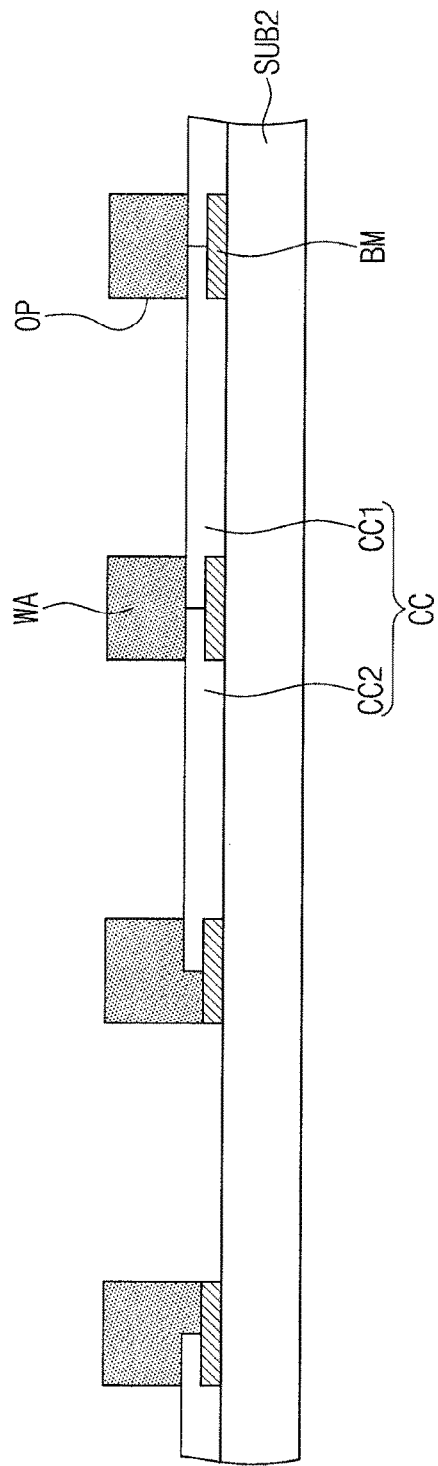

Thereafter, a partition member WA is formed at a position corresponding to the light blocking member BM as shown in FIG. 7C. The partition member WA may be formed so as to correspond to an array of pixels. The partition member WA is formed by forming an initial film on the entire surface of the second substrate SUB2 where the light blocking member BM and the blocking pattern member CC are formed and then performing a photolithography process so as to have the same (e.g., substantially the same) shape as the light blocking member BM. The partition member WA is disposed on the second substrate SUB2 to define a plurality of opening parts. The partition member WA has an insulating property and may include a light absorbing material to prevent (or reduce) color mixing between the plurality of pixels PX.

The plurality of opening parts of the partition member WA may be provided in a matrix form overlapping with at least one or more pixels PX on a plane. Also, the opening part OP may be provided in a stripe form on the plane and may overlap with at least one or more pixels PX arranged in one direction. The shape of the partition member WA is not limited. For example, it may be formed in a taper shape.

Figure 7D:
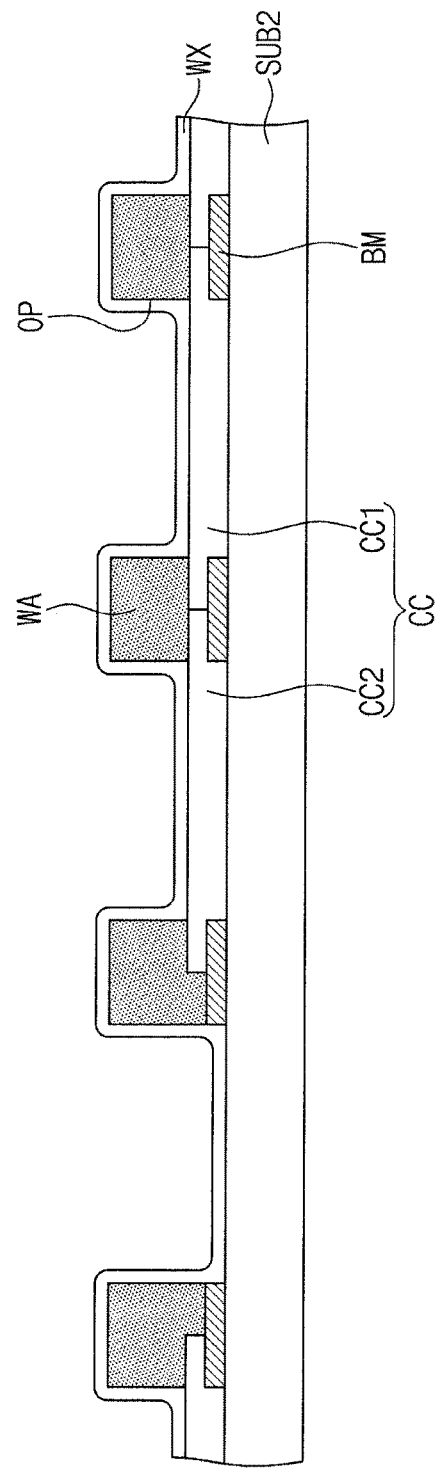

Thereafter, as shown in FIG. 7D, a liquid-repellent coating layer WX is formed covering the partition member WA. The liquid-repellent coating layer WX is placed on the blocking pattern member CC to cover the partition member WA and the parts exposed by of the partition member WA of the blocking pattern member CC. The liquid-repellent coating layer WX may include at least one of silicon and fluorine, for example. For example, the liquid-repellent coating layer WX may be a fluorine-containing coating agent, a silane coupling agent, a gelling agent, or a silica-based coating agent, but if it is a general water repellent coating method, is not limited thereto. Liquid-repellence is given by the liquid-repellent coating layer WX, and the surface tension of quantum dots or fluorescent substances to be dropped on the liquid-repellent coating layer WX is then increased.

Figure 7E:
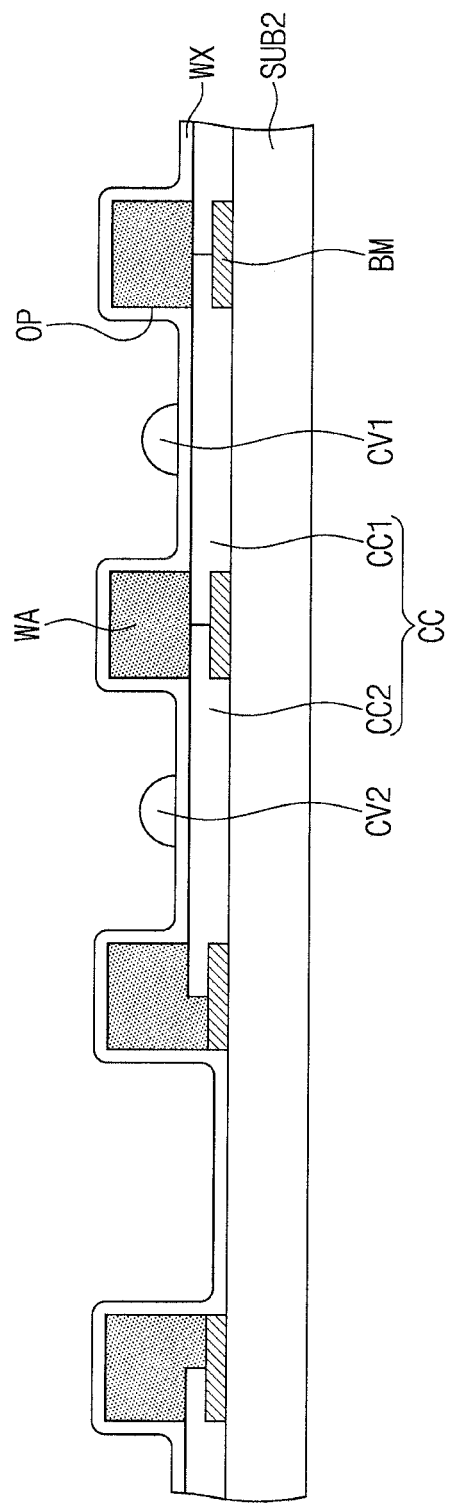

Then, as shown in FIG. 7E, the bent parts are formed on the corresponding opening part OP. A first bent part CV1 is formed in the first color conversion pattern 100 (see FIG. 7G) to be finally formed and a second bent part CV2 (see FIG. 7G) is formed in the second color conversion pattern 200. The first bent part CV1 and the second bent part CV2 may be sequentially formed by dropping and drying quantum dots or fluorescent substances emitting corresponding light. The inner surface tension of the quantum dots or fluorescent substances dropped due to the liquid repellency by the application on the corresponding liquid-repellent coating layer WX is increased, so that the bent portions may have a hemispherical shape on the cross section, or a shape in which at least a part of the spherical shape is removed.

Figure 7F:
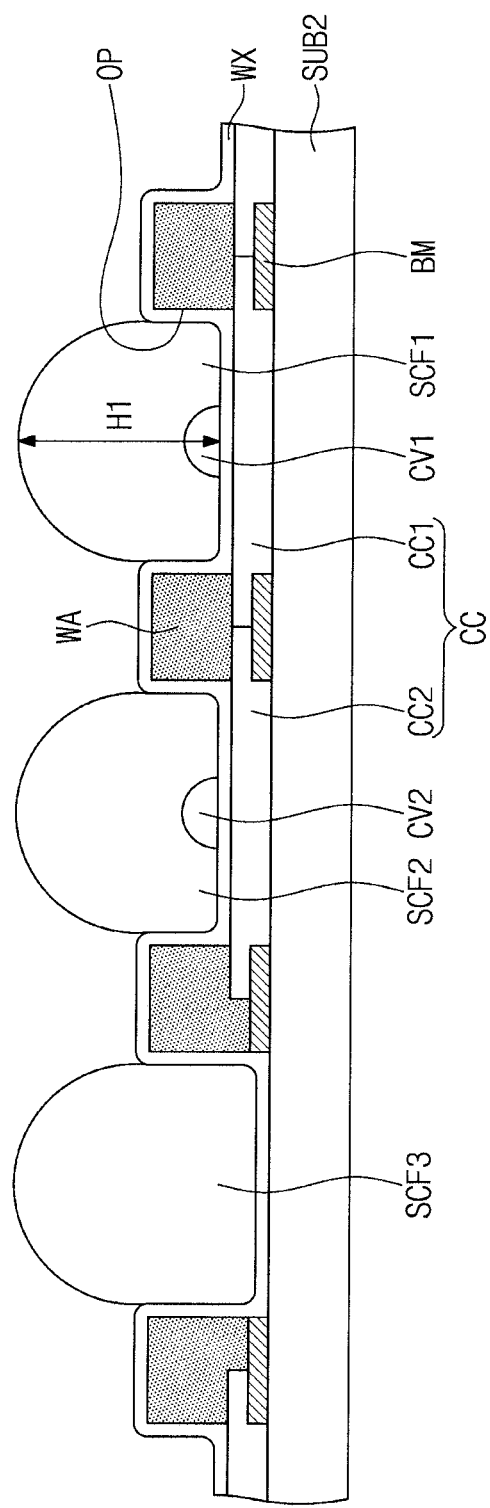
Figure 7G:
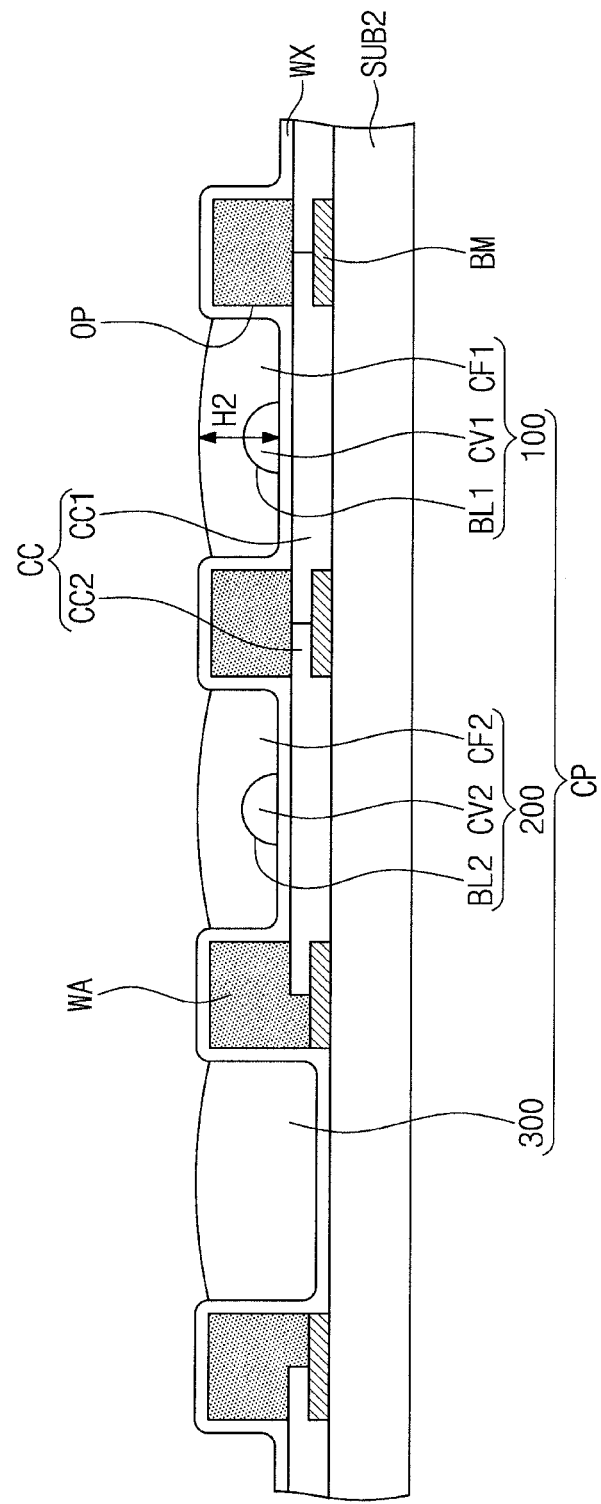

As shown in FIGS. 7F-7G, color conversion patterns are formed on the liquid-repellent coating layer WX of the corresponding opening part OP. The color conversion patterns may be formed through the drying process of the initial color conversion parts. For example, the initial color conversion parts may be filled in the corresponding opening parts OP, respectively. The initial color conversion parts consist of quantum dots or fluorescent substances that form different light. Furthermore, a first initial color conversion part SCF1 is filled in the first color conversion pattern 100 to be finally formed and a second initial color conversion part SCF2 is filled in the second color conversion pattern 200 and a third initial color conversion part SCF3 is filled in the third initial color conversion pattern 300.

The first initial color conversion part SCF1 has the same (e.g., substantially the same) quantum dots or fluorescent substances as the first bent part CV1 and the second initial color conversion part SCF2 has the same (e.g., substantially the same) quantum dots or fluorescent substances as the second bent part CV2. The third initial color conversion part SCF3 may include at least one of a scattering material, for example, a polymer such as titanium oxide (TiO2) and a photosensitive resin, or a blue dye. However, if the third initial color conversion part SCF3 is a material that scatters and does not convert blue light, it may be variously modified and filled without being limited thereto.

The first initial color conversion part SCF1 may be filled in the corresponding opening part OP to have the first height H1. The first height H1 may be defined as the longest distance in the thickness direction from the upper surface of the liquid repellent coating layer WX to the upper surface of the first initial color conversion part SCF1.

The first height H1 may be between 45 um and 60 um. This is because when the color conversion parts are filled below 45 um, the height may decrease during the drying process, resulting in a not-fill phenomenon and when the color conversion parts are filled over 60 um, an overflow phenomenon occurs in which color mixing occurs with adjacent color conversion parts emitting different light.

The first color conversion part CF1 may have a second height H2. The second height H2 may be defined substantially in such a manner that the first height H1 is defined. For example, the first color conversion part CF1 is formed as the first initial color conversion part SCF1 is dried so that the first color conversion part CF1 has the second height H2 reduced by the first height H1. This may be due to drying of a liquid such as a solvent present in the first initial color conversion part SCF1 by a drying process.

On the other hand, this is exemplarily described, and the height variation corresponding to the first color conversion part CF1 may occur in each of the second color conversion part CF2 and the third color conversion pattern 300 by the drying process, and is not limited to any one embodiment.

By drying the initial color conversion parts, color conversion patterns that provide different light are formed. For example, the first color conversion pattern 100 may emit red light by receiving blue light from the backlight unit BLU (see FIG. 1B). The second color conversion pattern 200 may receive blue light from the backlight unit BLU and emit green light. The third color conversion pattern 300 may transmit blue light, which is received from the backlight unit BLU, as it is and emit the blue light. The emitted light of the first color conversion pattern 100 and the second color conversion pattern 200 may be mutually modified, but is not limited thereto.

In relation to the first color conversion pattern 100, a first interfacial surface BL1 is formed at a portion where the first bent part CV1 overlaps with the first color conversion part CF1. In relation to the second color conversion pattern 200, a second interfacial surface BL2 is formed at a portion where the second bent part CV2 overlaps with the second color conversion part CF2. Each interfacial surface is formed by the time difference in which the corresponding color conversion parts are filled after the curing process of the bent parts.

The corresponding bent parts and color conversion parts are made of the same (e.g., substantially the same) quantum dots or fluorescent substances. Thus, when a single process is used to fill quantum dots or fluorescent substances in the liquid-repellent coating layer WX, in order to overcome the not-fill phenomenon caused by the accumulation of quantum dots or fluorescent substances due to an increase in surface tension, it is possible to prevent (or reduce) an overflow phenomenon that occurs when the liquid is filled a plurality of times, thereby improving the color reproducibility.

Figure 7H:
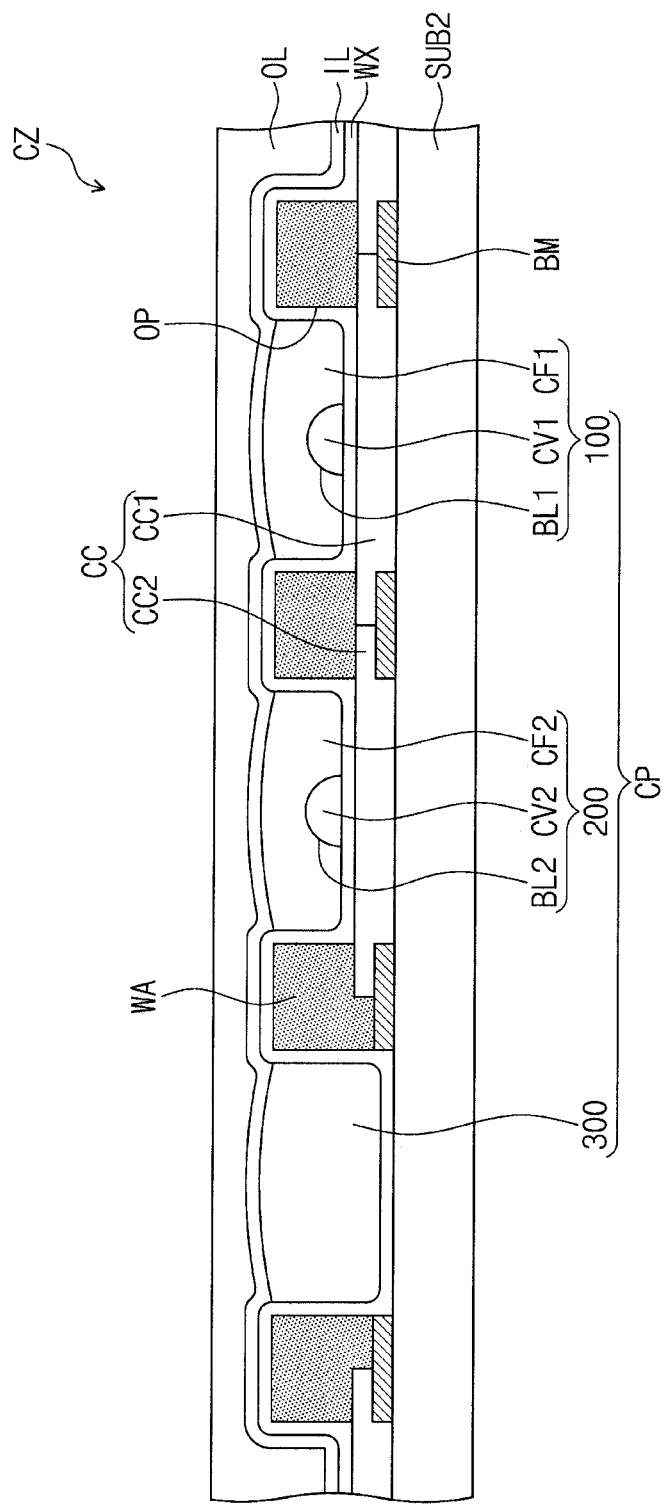

Then, as shown in FIG. 7H, an inorganic film layer IL may be deposited on the dried color conversion patterns. The inorganic film layer IL may be formed by coating with at least one of silicon oxide (SiOx) and silicon nitride (SiNx). The deposition of the inorganic film layer is a general method and thus, is not limited to the chemical/physical vapor deposition method. The inorganic film layer IL prevents (or reduces) oxygen/moisture inflow into the color conversion patterns.

The organic film layer OL is coated on the inorganic film layer IL. The organic film layer OL includes at least one of polyimide, polyethylene terephthalate, polycarbonate, epoxy, polyethylene, and polyacrylate, and may be a single film or a laminated film. One side of the organic film layer OL overlaps the inorganic film layer IL and the backside provides planarization.

FIGS. 8A-8D illustrate a method of manufacturing a display device according to an embodiment of the present disclosure. Reference numerals similar to those of FIGS. 7C-7H are used and redundant descriptions thereof are not necessary here.

In an embodiment of the present disclosure, the partition member WA and the third color conversion pattern 300-W may be concurrently (e.g., simultaneously) formed. As the initial film 300-S applied on the second substrate SUB2 is concurrently (e.g., simultaneously) patterned through one mask, the partition member WA and the third color conversion pattern 300-W may be concurrently (e.g., simultaneously) patterned. Thus, the process may be simplified and the cost may be reduced.

Referring to FIG. 8A, the initial film 300-S is formed on the second substrate SUB2 where a light blocking member BM and a blocking pattern member CC are formed. Referring to FIG. 8B, the initial film 300-S is etched to form the partition member WA and the third color conversion pattern 300-W. The partition member WA is formed by overlapping the light blocking member BM and exposes at least a part of the first color blocking pattern CC1 and at least a part of the second color blocking pattern CC2. The third color conversion pattern 300-W may be formed to overlap the light blocking member BM and the corresponding opening part OP. The third color conversion pattern 300-W may overlap with at least one pixel of the pixels PX and may function as a partition defining adjacent opening parts OP at the same (e.g., substantially the same) time. Accordingly, the third color conversion pattern 300-W may transmit set (e.g., predetermined) light and prevent (or reduce) color mixing between adjacent lights.

The third color conversion pattern 300-W may include the same (e.g., substantially the same) material as the partition member WA. Accordingly, the third color conversion pattern 300-W may be formed concurrently (e.g., simultaneously) with the partition member WA through one mask. Therefore, the cost may be reduced, the process may be simplified, and the process time may be shortened.

The initial film 300-S may include at least one of a scattering material, for example, a polymer such as titanium oxide ($TiO_2$) and a photosensitive resin, or a blue dye. However, if the initial film 300-S is a material that scatters and does not convert blue light, it may be variously modified without being limited thereto. Accordingly, the third color conversion pattern 300-W transmits blue color, which is supplied from the backlight unit BLU (see FIG. 1B) as it is, and transmits the blue color.

Figure 8C:
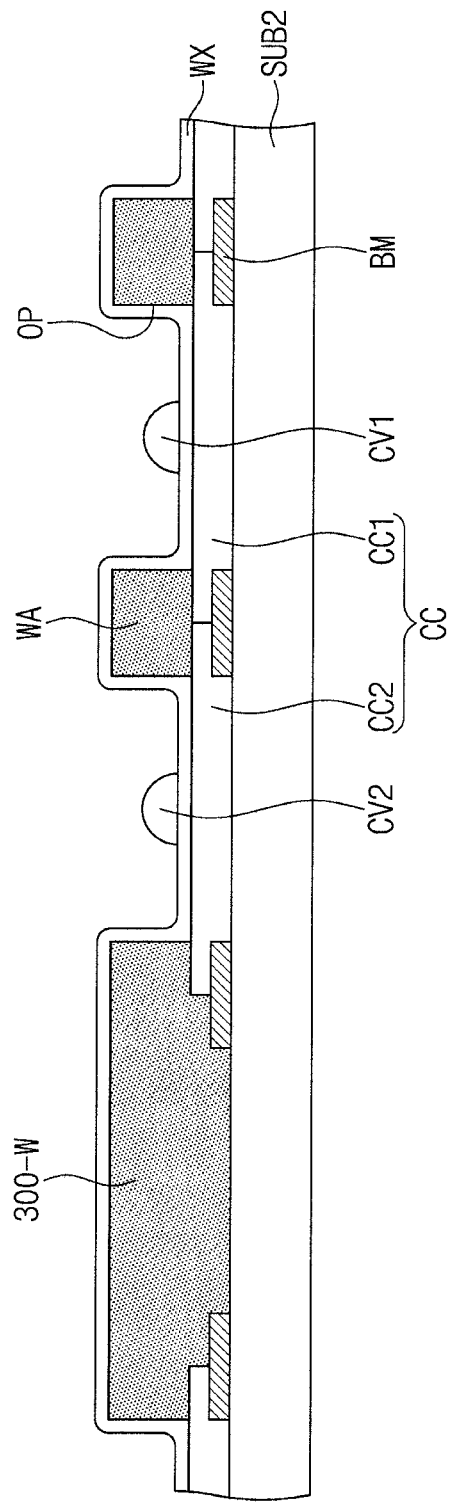
Figure 8D:
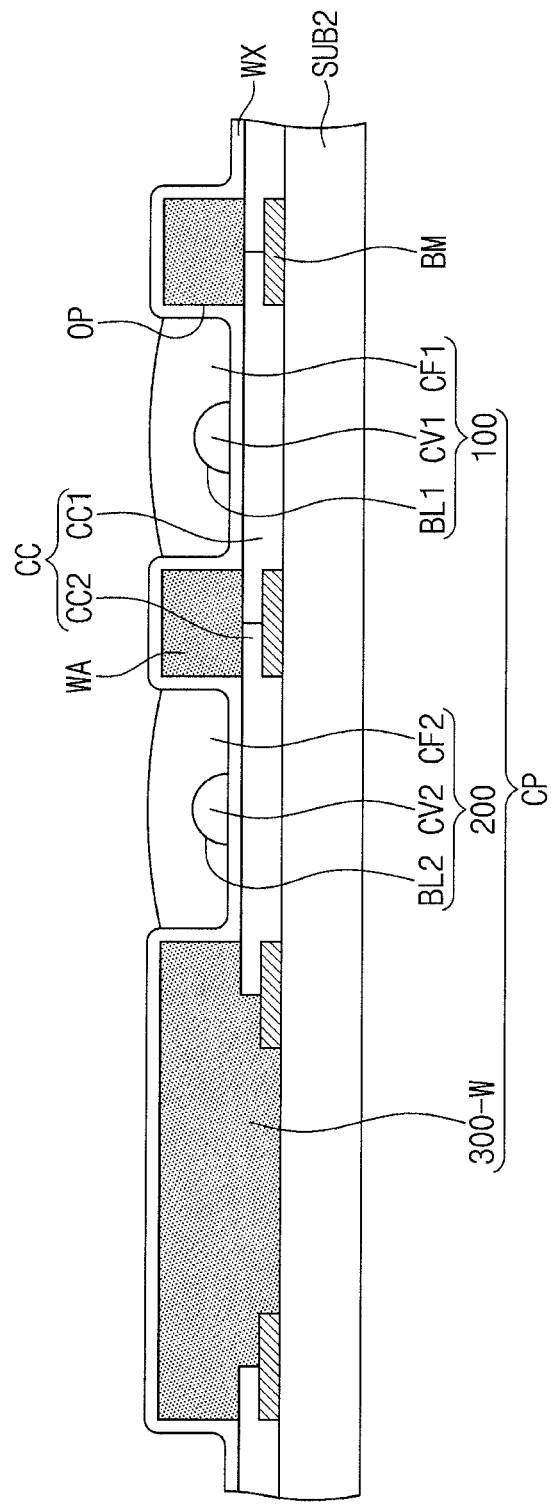

Referring to FIGS. 8C-8D, the liquid-repellent coating layer WX is applied on the partition member WA formed between the third color conversion pattern 300-W and the blocking pattern member CC, and the first color conversion pattern 100 and the second color conversion pattern 200. For example, the liquid-repellent coating layer WX is coated on the third color conversion pattern 300-W.

After the curing of the liquid-repellent coating layer WX, the bent parts CV are formed in the corresponding opening part OP of the first color conversion pattern 100 and the second color conversion pattern 200. Color conversion parts covering each bent part CV are filled and color conversion patterns emitting different light are formed.

Since the third color conversion pattern 300-W is formed at the same (e.g., substantially the same) time as the partition member is formed, it is possible to omit a separate process for filling the third color conversion pattern 300-W, thereby shortening the process time and improving the productivity.

According to the above description, if the liquid-repellent coating layer is directly filled with a color conversion pattern consisting of quantum dots or fluorescent substances of color filter members, the not-fill phenomenon occurs due to the increase of the surface tension due to the liquid repellence of the surface, and in order to overcome the not-fill phenomenon, an overflow phenomenon occurs in reapplication. To prevent (or reduce) this, by forming the bent parts made of the same (e.g., substantially the same) material as the color conversion patterns, it is possible to prevent (or reduce) the not-fill or overflow phenomenon occurring when filling the color conversion patterns, thereby improving the color reproducibility of the display device.

Although exemplary embodiments of the present disclosure have been described, it is understood that the present disclosure should not be limited to these exemplary embodiments but various changes and modifications can be made by one ordinary skilled in the art within the spirit and scope of the inventive concept as hereinafter claimed.

What is claimed is:

1. A display device comprising:
    a display panel comprising a plurality of pixels and a base substrate; and
    a color filter member disposed on the display panel and configured to receive a light provided from the plurality of pixels,
    wherein the color filter member comprises:
        a partition member where a plurality of opening parts each overlapping with at least one of the plurality of pixels on a plane is defined;
        a liquid-repellent coating layer configured to cover the partition member; and
        a color conversion member comprising a first color conversion pattern and a second color conversion pattern, which are disposed in each of the opening parts and provide different light,
    wherein the first color conversion pattern comprises a first bent part having a curved surface facing away from the liquid-repellent coating layer and a first color conversion part having a curved surface facing the first bent part, which comprise the same material and contact each other at their respective curved surfaces to form an interface; and
    the second color conversion pattern comprises a second bent part having a curved surface facing away from the liquid-repellent coating layer and a second color conversion part having a curved surface facing the second bent part, which comprise the same material and contact each other at their respective curved surfaces to form an interface.

2. The display device of claim 1, wherein the color conversion member comprises at least one of a plurality of quantum dots and a plurality of fluorescent substances corresponding to the different light.

3. The display device of claim 1, wherein the color filter member further comprises blocking pattern is disposed between the base substrate and the color conversion member and blocking a blue light.

4. The display device of claim 1, wherein the color filter member further comprises a light blocking member overlapping at least a part of the partition member and blocking light.

5. The display device of claim 4, wherein the light blocking member has the same form as the partition member and is made of a light blocking material for blocking light.

6. The display device of claim 1, wherein the first bent part overlaps one opening part among the plurality of opening parts and is disposed in plurality being spaced apart from each other, and the plurality of first bent parts are covered by the first color conversion part.

7. The display device of claim 1, wherein the first bent part overlaps one opening part among the plurality of opening parts and is provided in plurality, and the plurality of first bent parts are stacked in a thickness direction and disposed,
    wherein the interface is formed between first bent parts contacting the first color conversion part among the plurality of first bent parts.

8. The display device of claim 1, wherein the interface has a curved form.

9. The display device of claim 1, wherein the color filter member further comprises a third color conversion pattern disposed in the opening parts and configured to provide different light from the first color conversion pattern and the second color conversion pattern.

10. The display device of claim 9, wherein the third color conversion pattern is made of the same material as the partition member.

11. The display device of claim 10, wherein the third color conversion pattern is covered by the liquid-repellent coating layer.

12. The display device of claim 1, wherein the first color conversion pattern overlaps at least two pixels among the pixels.

13. The display device of claim 1, wherein each of the plurality of pixels comprises a thin film transistor and a liquid crystal capacitor coupled to the thin film transistor.

14. The display device of claim 1, wherein each of the plurality of pixels comprises a thin film transistor and an organic light emitting element coupled to the thin film transistor.

15. The display device of claim 1, wherein the light is blue light.

16. A method of manufacturing a display device, the method comprising:
    forming a partition member by forming an initial film on a base substrate and forming a plurality of opening parts in the initial film;
    forming a liquid-repellent coating layer by covering the opening parts and the partition member with a liquid-repellent material;
    forming a first pattern and a second pattern by dropping first quantum dots and second quantum dots in each of a first opening part and a second opening part different from each other among the opening parts;
    forming a first bent part having a curved surface facing away from the liquid-repellent coating layer and a second bent part having a curved surface facing away from the liquid-repellent coating layer by drying the first quantum dots and the second quantum dots filled in the first pattern and the second pattern, respectively;
    forming a third pattern and a fourth pattern by filling the first quantum dots in the first opening part and filling the second quantum dots in the second opening part, respectively; and
    forming a first color conversion part having a curved surface facing the first bent part and a second color conversion part having a curved surface facing the second bent part by drying the third pattern and the fourth pattern.

17. The method of claim 16, further comprising forming a plurality of first patterns by dropping the first quantum dots in the first opening part a plurality of times along one direction.

18. The method of claim 16, further comprising forming a plurality of first patterns stacked in a thickness direction by dropping the first quantum dots at a fixed same position in the first opening part a plurality of times.

19. The method of claim 18, further comprising forming an interface by drying individually each time the first quantum dots are dropped in the thickness direction and stacked.

20. The method of claim 16, wherein the forming of the initial film on the base substrate comprises forming a third color conversion part comprising the same material as the initial film and having the same thickness as the initial film.

* * * * *